(12) United States Patent
Hu et al.

(10) Patent No.: US 11,183,511 B2
(45) Date of Patent: Nov. 23, 2021

(54) MEMORY DEVICE AND MANUFACTURING METHOD FOR THE SAME

(71) Applicant: MACRONIX INTERNATIONAL CO., LTD., Hsinchu (TW)

(72) Inventors: Chih-Wei Hu, Toufen Township, Miaoli County (TW); Teng-Hao Yeh, Zhubei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 272 days.

(21) Appl. No.: 16/257,165

(22) Filed: Jan. 25, 2019

(65) Prior Publication Data
US 2020/0243555 A1 Jul. 30, 2020

(51) Int. Cl.
*H01L 27/115* (2017.01)
*H01L 27/105* (2006.01)
*H01L 27/11582* (2017.01)
*H01L 27/1157* (2017.01)
*H01L 27/11565* (2017.01)
*H01L 21/28* (2006.01)

(52) U.S. Cl.
CPC .... *H01L 27/11582* (2013.01); *H01L 27/1157* (2013.01); *H01L 27/11565* (2013.01); *H01L 29/40117* (2019.08)

(58) Field of Classification Search
None
See application file for complete search history.

(56) References Cited

U.S. PATENT DOCUMENTS

| 2015/0194435 A1* | 7/2015 | Lee | H01L 27/11582 |
| | | | 257/329 |
| 2017/0154892 A1 | 6/2017 | Oh | |
| 2019/0123060 A1* | 4/2019 | Wang | H01L 27/1157 |

OTHER PUBLICATIONS

TW Office Action dated Apr. 30, 2020 in Taiwan application (No. 108102916).

* cited by examiner

*Primary Examiner* — Joseph C. Nicely
*Assistant Examiner* — Lamont B Koo
(74) *Attorney, Agent, or Firm* — McClure, Qualey & Rodack, LLP

(57) ABSTRACT

A memory device and a manufacturing method for the same are provided. The memory device comprises a stack structure and a channel structure. The stack structure is on a substrate and comprises gate electrodes and insulating films stacked alternately. The channel structure is electrically coupled to the gate electrodes, and is on sidewall surfaces of the gate electrodes. The channel structure comprises a first channel structure and a second channel structure. The second channel structure is on an upper surface of the first channel structure. The first channel structure and/or the second channel structure has a ring shape.

9 Claims, 26 Drawing Sheets

MEMORY DEVICE AND MANUFACTURING METHOD FOR THE SAME

BACKGROUND

Technical Field

The disclosure relates to a memory device and a manufacturing method for the same.

Description of the Related Art

As critical dimensions of devices in integrated circuits shrink toward perceived limits of manufacturing technologies, designers have been looking to techniques to achieve greater storage capacity, and to achieve lower costs per bit. Technologies being pursued include a NAND memory and an operation performed therefor.

SUMMARY

The present disclosure relates to a memory device and a manufacturing method for the same.

According to an embodiment, a memory device is disclosed. The memory device comprises a stack structure and a channel structure. The stack structure is on a substrate and comprises gate electrodes and insulating films stacked alternately. The channel structure is electrically coupled to the gate electrodes, and is on sidewall surfaces of the gate electrodes. The channel structure comprises a first channel structure and a second channel structure. The second channel structure is on an upper surface of the first channel structure. The first channel structure and/or the second channel structure has a ring shape.

According to another embodiment, a manufacturing method for a memory device is disclosed. The manufacturing method comprises the following steps. A first stack layer is formed. The first stack layer comprises conductive layers insulated from each other by insulating films. A first trench is formed in the first stack layer. A charge storage layer is formed in the first trench. A second stack layer is formed on the first stack layer. A second trench is formed in the second stack layer. A gate dielectric layer is formed in the second trench.

The above and other embodiments of the disclosure will become better understood with regard to the following detailed description of the non-limiting embodiment(s). The following description is made with reference to the accompanying drawings.

DETAILED DESCRIPTION

The illustrations may not be necessarily drawn to scale, and there may be other embodiments of the present disclosure which are not specifically illustrated. Thus, the specification and the drawings are to be regard as an illustrative sense rather than a restrictive sense. Moreover, the descriptions disclosed in the embodiments of the disclosure such as detailed construction, manufacturing steps and material selections are for illustration only, not for limiting the scope of protection of the disclosure. The steps and elements in details of the embodiments could be modified or changed according to the actual needs of the practical applications. The disclosure is not limited to the descriptions of the embodiments. The illustration uses the same/similar symbols to indicate the same/similar elements.

FIG. 1 to FIG. 20 illustrate a method for manufacturing a memory device according to an embodiment.

Figure 1:
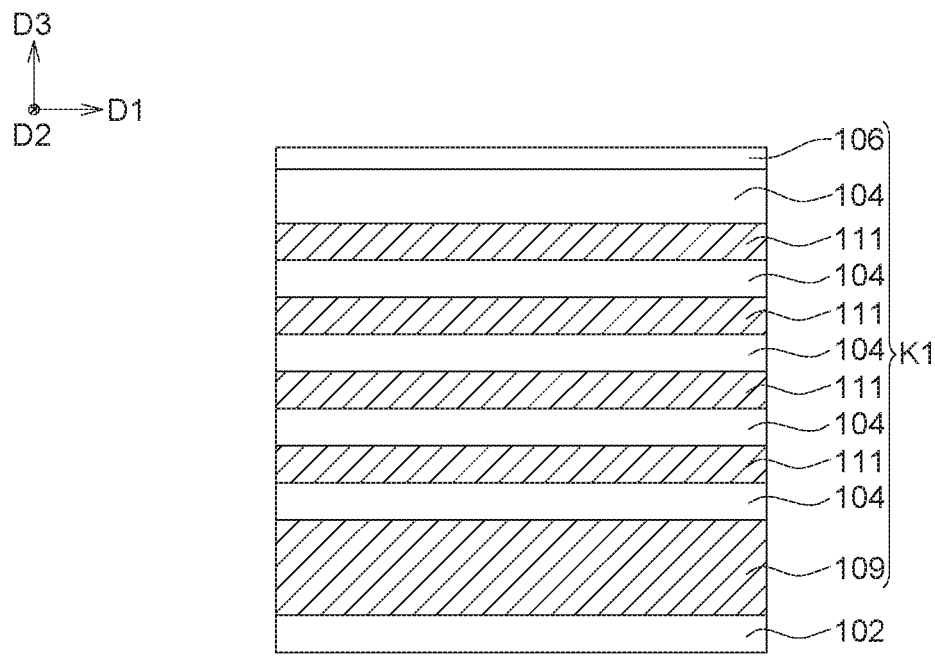
FIG. 1 to FIG. 20 illustrate a method for manufacturing a memory device according to an embodiment.

Referring to FIG. 1, conductive layers and insulating films may be stacked alternately on a substrate 102 to form a first stack layer K1 conductive layer. In an embodiment, the substrate 102 may comprise a silicon substrate. The first stacked layer K1 may be formed on an insulating layer on the silicon substrate. For example, the insulating layer comprises silicon oxide and so on. The conductive layers comprise a bottom conductive layer 109 of the bottom and conductive layers 111 above the bottom conductive layer 109. The bottom conductive layer 109 and the conductive layers 111 may comprise a conductive material such as a conductor material or a semiconductor material. The semiconductor material comprises a polysilicon, such as doped polysilicon. The insulating films may comprise insulating films 104 and an etching stop layer 106. The etching stop layer 106 may be formed on the top one of the insulating films 104. In an embodiment, the insulating films 104 may comprise an oxide such as silicon oxide. The etching stop layer 106 may comprise a nitride such as silicon nitride.

Figure 2:
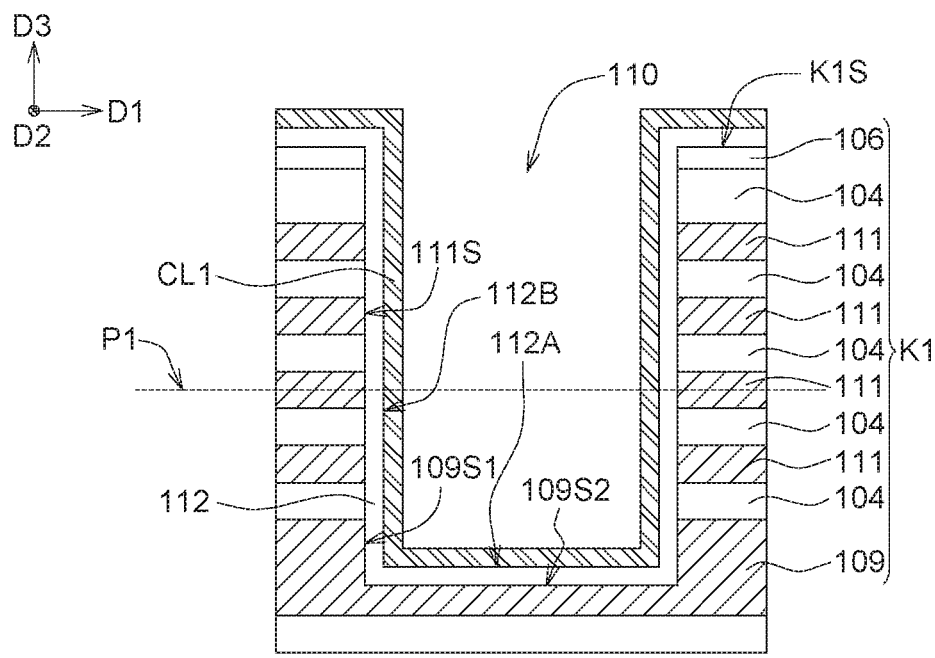
Figure 2A:
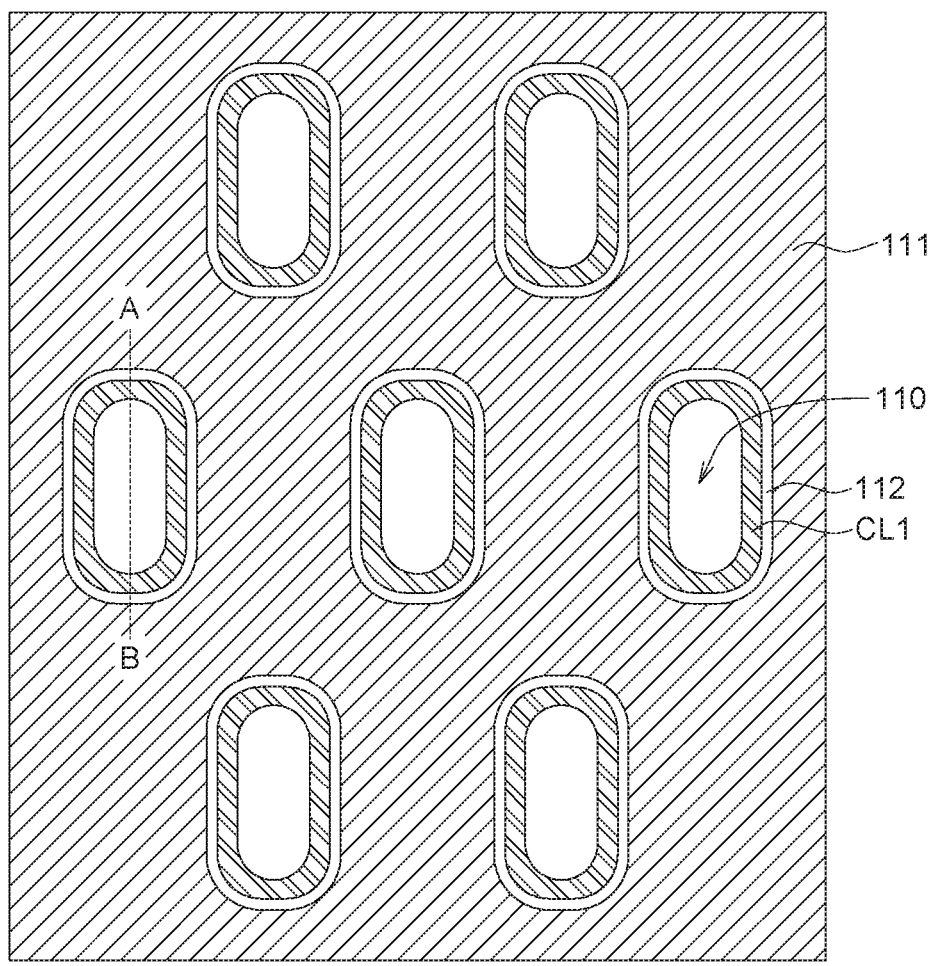

Referring to FIG. 2, a first trench 110 may be formed in the first stacked layer K1 by using a patterning process. The first trench 110 may expose a sidewall surface of the first stacked layer K1, comprising a sidewall surface 111S of the conductive layers 111, and a sidewall surface 109S1 of the bottom conductive layer 109, and may expose an upper surface 109S2 of the bottom conductive layer 109. A charge storage layer 112 may be formed in the first trench 110. The charge storage layer 112 may be formed on the sidewall surface of the first stacked layer K1 and the upper surface 109S2 of the bottom conductive layer 109 exposed by the first trench 110, and on an upper surface K1S of the first stacked layer K1. A first channel structure CL1 may be formed on an upper surface 112A and a sidewall surface 112B of the charge storage layer 112 exposed by the first trench 110. The charge storage layer 112 between the first stacked layer K1 (comprising the sidewall surface 111S of the conductive layers 111 and the sidewall surface 109S1 and the upper surface 109S2 of the bottom conductive layer 109) and the first channel structure CL1 may have an ONO structure, an ONONO structure, an ONONONO structure, or silicon oxynitride/silicon nitride/oxide structure. The first channel structure CL1 may comprise polysilicon semiconductor material, comprising a doped semiconductor material or an un-doped semiconductor material. In an embodiment, a material of the first channel structure CL1 comprises a polysilicon, such as a doped polysilicon or an un-doped polysilicon FIG. 2A illustrates a top view of the structure of FIG. 2 along a lateral cross-section view P1. As shown in FIG. 2A, the charge storage layer 112 and the first channel structure CL1 in the first trench 110 have a ring shape, the ring shape including a substantially circle or an substantially ellipse. For example, the first channel structure CL1 has a hollow ring shape, a solid ring shape, a hollow semi-ring shape or a solid semi-ring shape. FIG. 2 may be a longitudinal cross-section view of the structure in FIG. 2A along AB line.

Figure 3:
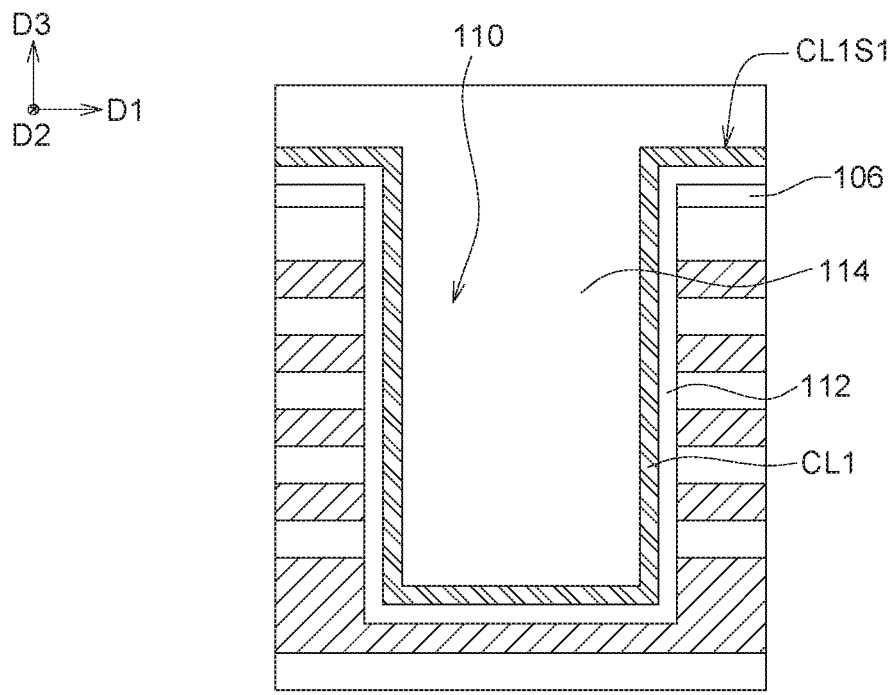

Referring to FIG. 3, an insulating layer 114 may be formed to fill the first trench 110, and on an upper surface CL1S1 of the first channel structure CL1. The insulating layer 114 is formed on the first channel structure CL1 exposed by the first trench 110. In an embodiment, a material of the insulating layer 114 comprises an oxide such as silicon oxide.

Figure 4:
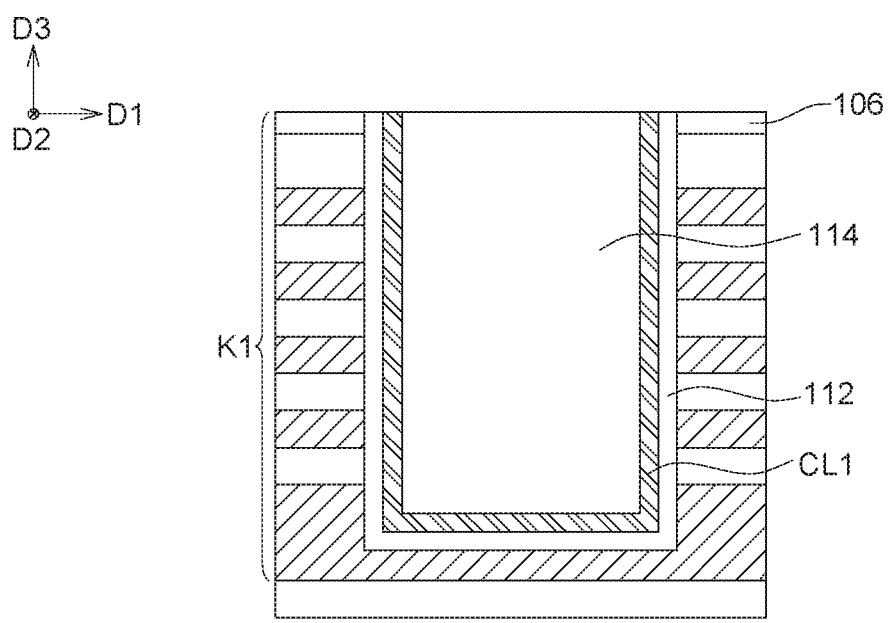

Referring to FIG. 4, a portion of the charge storage layer 112, the first channel structure CL1 and the insulating layer 114 over the first stacked layer K1 may be removed by an etching back process. In an embodiment, the etching back process may comprise chemical mechanical polishing method or other suitable etching methods. The etching back process may form a structure having a flat upper surface.

Figure 5:
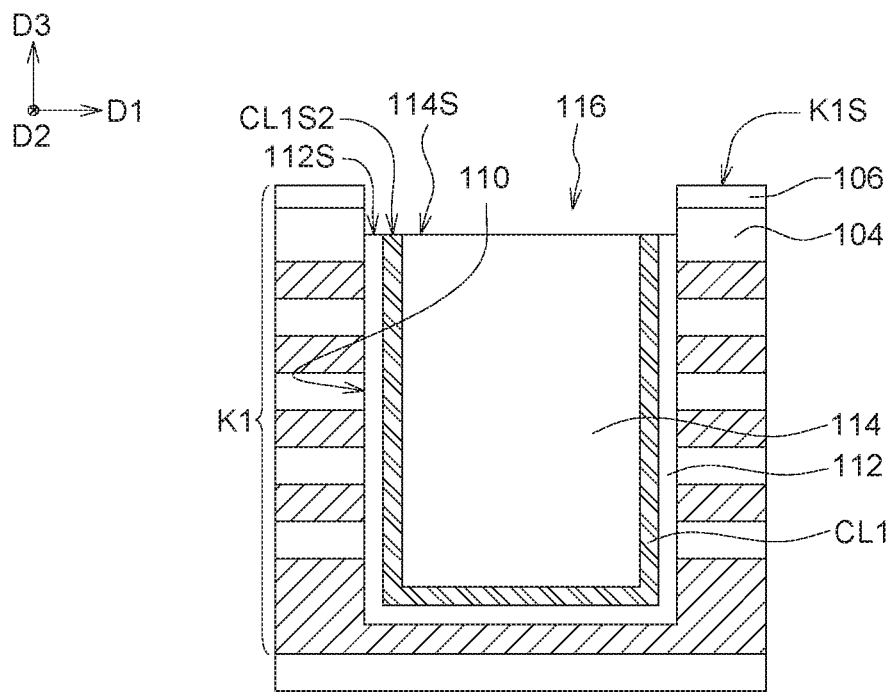

Referring to FIG. 5, an upper portion of the charge storage layer 112, the first channel structure CL1 and the insulating layer 114 may be removed to form a recess 116 recessed from the upper surface K1S of the first stacked layer K1. The recess 116 exposes an upper surface 112S of the charge storage layer 112, an upper surface CL1S2 of the first channel structure CL1, an upper surface 114S of the insulating layer 114, and a sidewall surface 108S of the insulating film 108. In an embodiment, the removing step may be performed by using a selective etching process with using the etching stop layer 106 as an etching mask. In this case, the recess 116 may substantially aligns with the first trench 110. For example, a size of the recess 116 in the first direction D1 may be substantially equal to a size of the first trench 110 in the first direction D1. A size of the recess 116 in the second direction D2 may be substantially equal to a size of the first trench 110 in the second direction D2. In another embodiment, the recess 116 may be formed by patterning process performed to the structure shown in FIG. 4. In this case, a size/shape of the recess 116 may be different from a size/shape of the first trench 110.

Figure 6:
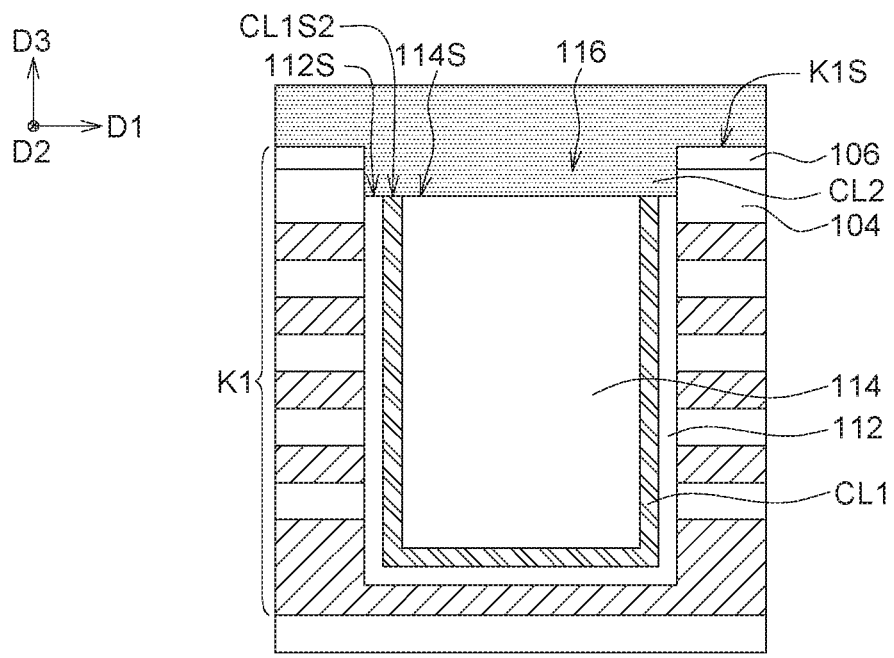

Referring to FIG. 6, a connection layer CL2 may be formed to fill the recess 116, and on the upper surface 112S of the charge storage layer 112, the exposed upper surface CL1S2 of the first channel structure CL1, and the upper surface 114S of the insulating layer 114, the sidewall surfaces of the insulating film 104 and the etching stop layer 106 and the upper surface K1S of the first stack layer K1. A material of the connection layer CL2 may be identical with or different from a material of the first channel structure CL1. The material of the connection layer CL2 may comprise a conductive material or a semiconductor material. The semiconductor material may comprise a polysilicon material. In an embodiment, the material of the connection layer CL2 comprises a doped semiconductor material such as a doped polysilicon material, such as an N-type doped polysilicon, which has conductivity larger than an un-doped polysilicon.

Figure 7:
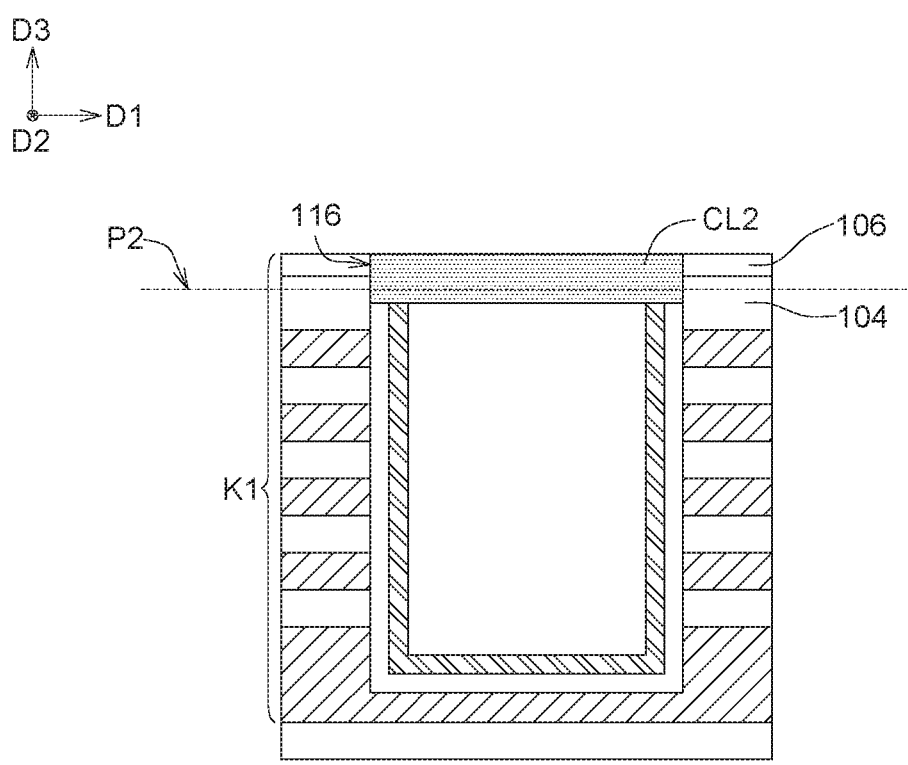

Referring to FIG. 7, a portion of the connection layer CL2 over the first stacked layer K1 may be removed by an etching back process. In an embodiment, the etching back process may comprise chemical mechanical polishing method or other suitable etching methods. The etching back process may form a structure having a flat upper surface.

Figure 7A:
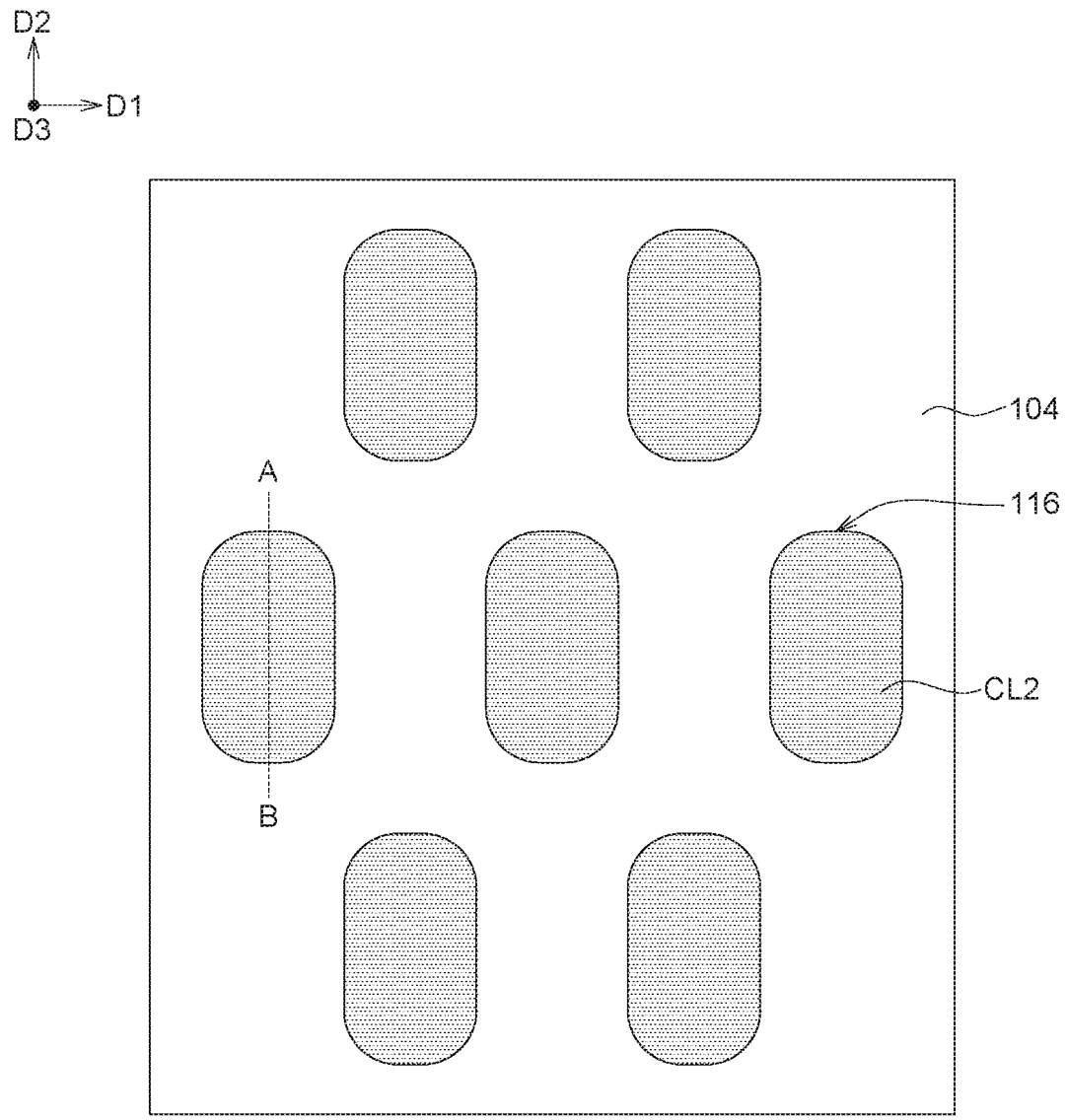

FIG. 7A illustrates a top view of the structure of FIG. 7 along a lateral cross-section view P2. As shown in FIG. 7A, the connection layer CL2 in the recess 116 has a solid ellipse shape. FIG. 7 may be a longitudinal cross-section view of the structure in FIG. 7A along the AB line, and the similar concept will not be repeated hereafter.

Figure 8:
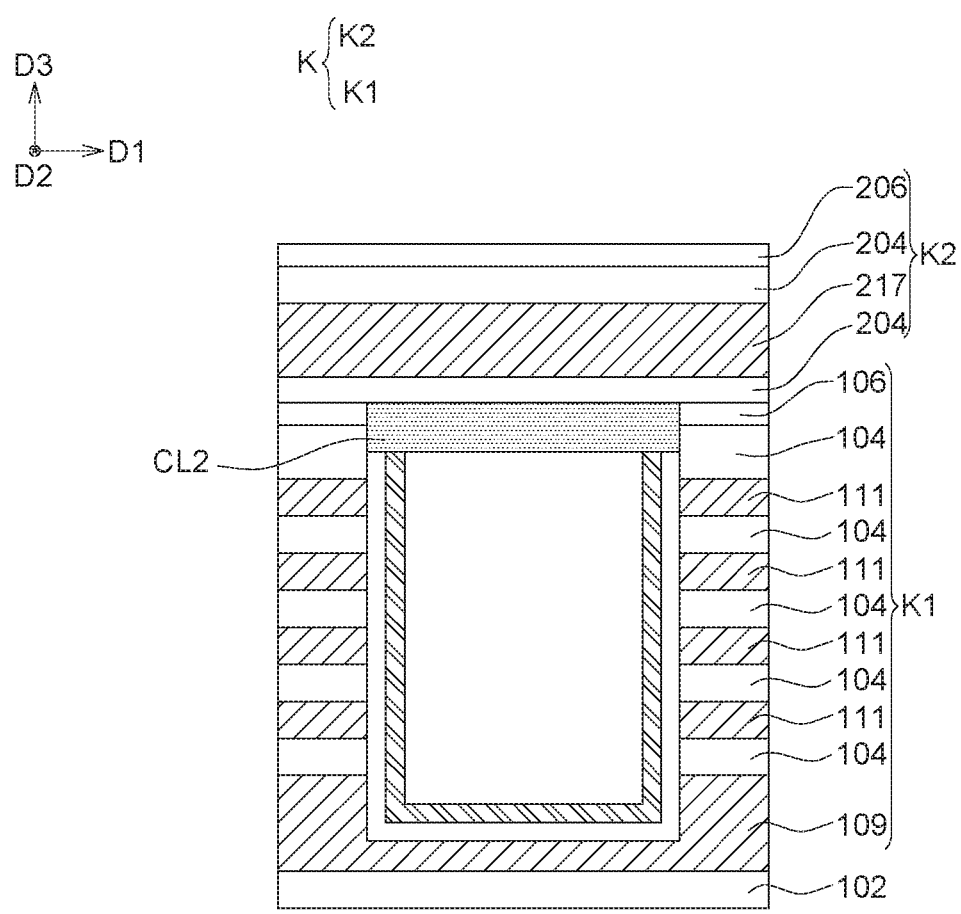

Referring to FIG. 8, a top conductive layer 217 and insulating films 204 are stacked alternately on the first stacked layer K1 and the connection layer CL2 to form a second stacked layer K2. The top conductive layer 217 may comprise a conductive material such as a conductor material or a semiconductor material. The semiconductor material comprises a polysilicon, such as doped polysilicon. An etching stop layer 206 may be formed on the top one of the insulating films 204. In an embodiment, the insulating films 204 may comprise an oxide such as silicon oxide. The etching stop layer 206 may comprise a nitride such as silicon nitride.

Figure 9:
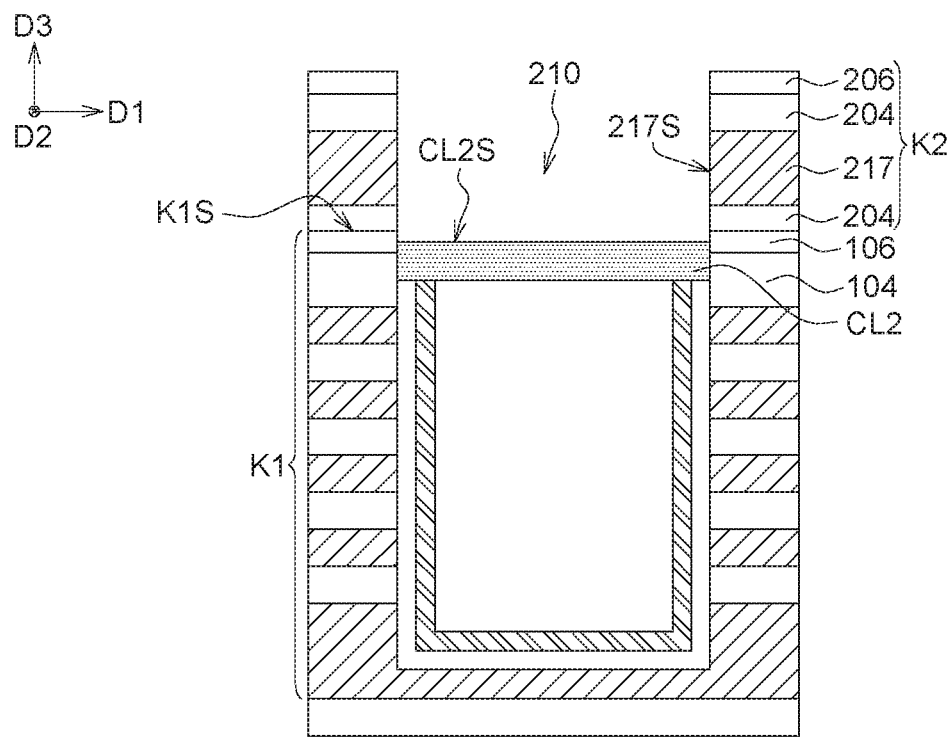

Referring to FIG. 9, the stack structure K comprises the first stack layer K1 and the second stack layer K2. A second trench 210 may be formed in the second stacked layer K2 comprising the top conductive layer 217 by using a patterning process. The patterning process comprises an etching process. The etching process for forming the second trench 210 may use the connection layer CL2 as an etching stop layer. The second trench 210 may expose a sidewall surface of the second stacked layer K2 (comprising a sidewall surface 217S of the top conductive layer 217, and sidewall surfaces of the insulating film 204 and the etching stop layer 206) and may expose an upper surface CL2S of the connection layer CL2. The upper surface CL2S of the connection layer CL2 may substantially aligns with the upper surface K1S of the first stacked layer K1. In an embodiment, the etching process may remove an upper portion of the connection layer CL2, and therefore the remained portion of the connection layer CL2 has the upper surface CL2S below upper surface K1S of the first stacked layer K1. The top conductive layer 217 may comprise a semiconductor material, comprising a polysilicon, such as an un-doped polysilicon.

Figure 10:
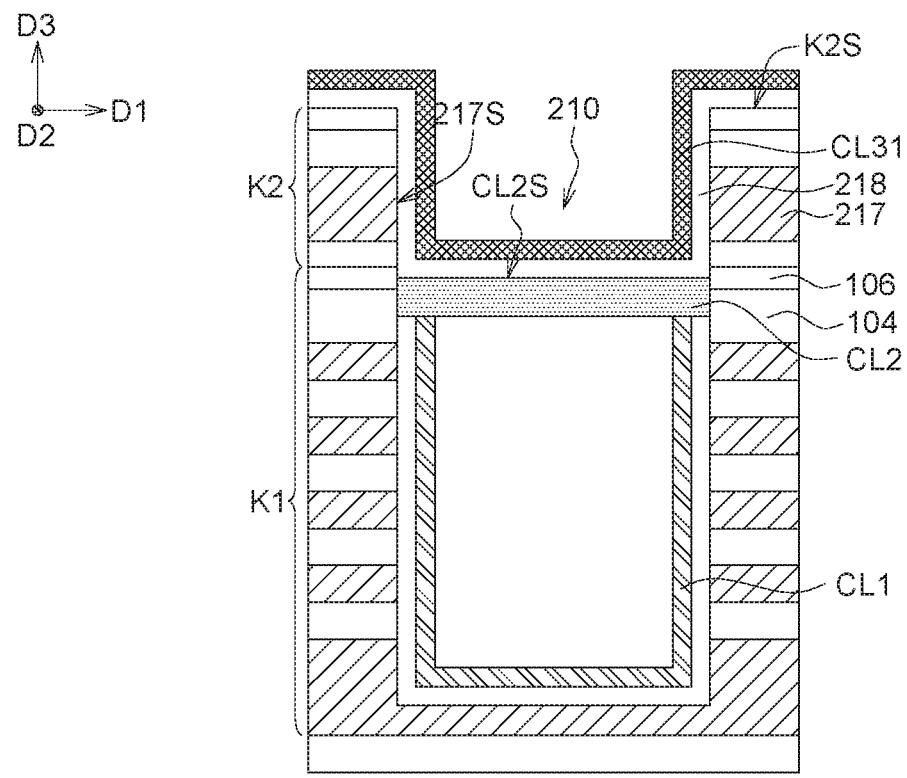

Referring to FIG. 10, a gate dielectric layer 218 is formed in the second trench 210. The gate dielectric layer 218 may be formed on the sidewall surface and the upper surface K2S of the second stacked layer K2, and the upper surface CL2S of the connection layer CL2. The gate dielectric layer 218 may be formed on the sidewall surface of the etching stop layer 106. A first channel layer CL31 may be formed on the gate dielectric layer 218 in the second trench 210, and on the gate dielectric layer 218 on the upper surface K2S of the second stacked layer K2. The first channel layer CL31 is formed on the sidewall surface and the upper surface of the gate dielectric layer 218. A material of the first channel layer CL31 may comprise a semiconductor material comprising a polysilicon material, such as an un-doped polysilicon. In an embodiment, the gate dielectric layer 218 is a gate oxide dielectric layer, and is adjoined between the sidewall surface of the second stacked layer K2 (comprising the sidewall surface 217S of the top conductive layer 217) and the first channel layer CL31. The gate oxide dielectric layer may comprise silicon oxide and the like. In an embodiment, the gate dielectric layer 218 consists of a single layer silicon oxide film, and in other words, the gate dielectric layer 218 is not a composite layer such as a composite layer comprising a silicon oxide film and a silicon nitride film.

Figure 11:
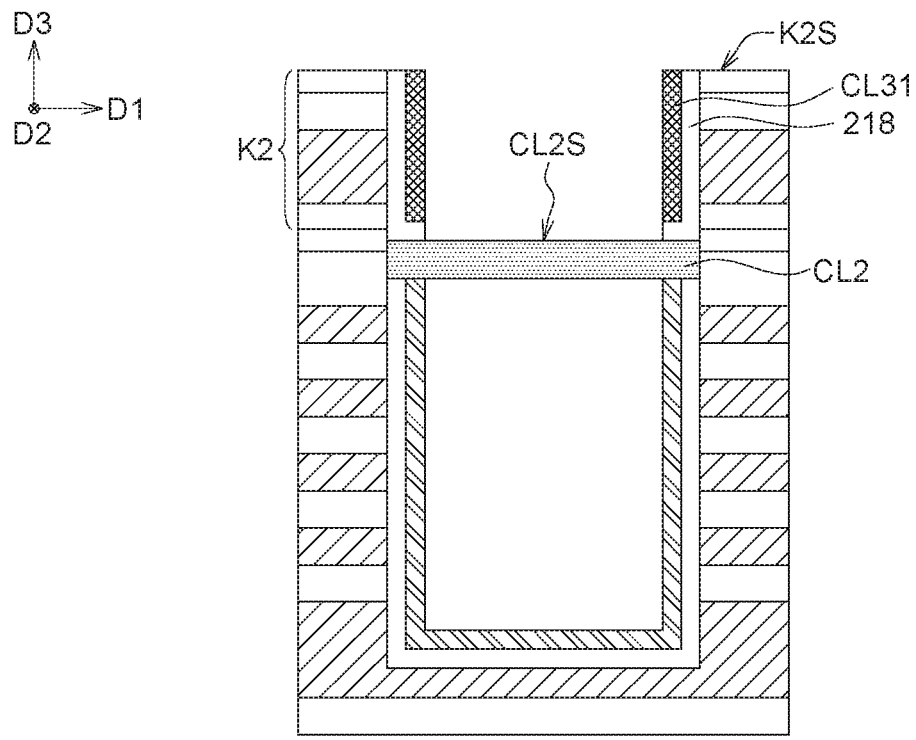

Referring to FIG. 11, portions of the first channel layer CL31 and the gate dielectric layer 218 over the upper surface CL2S of the connection layer CL2 and the upper surface K2S of the second stacked layer K2 may be removed by using an etching process, and portions of the first channel layer CL31 and the gate dielectric layer 218 on the sidewall surface of the second stacked layer K2 may be remained. The removing step may use an isotropic etching method. In an embodiment, the etching method may comprise a plasma etching process, and the first channel layer CL31 remained on the sidewall surface of the gate dielectric layer 218 may prevent the gate dielectric layer 218 from damage from the etching process. The etching process may stop on the connection layer CL2.

Figure 12:
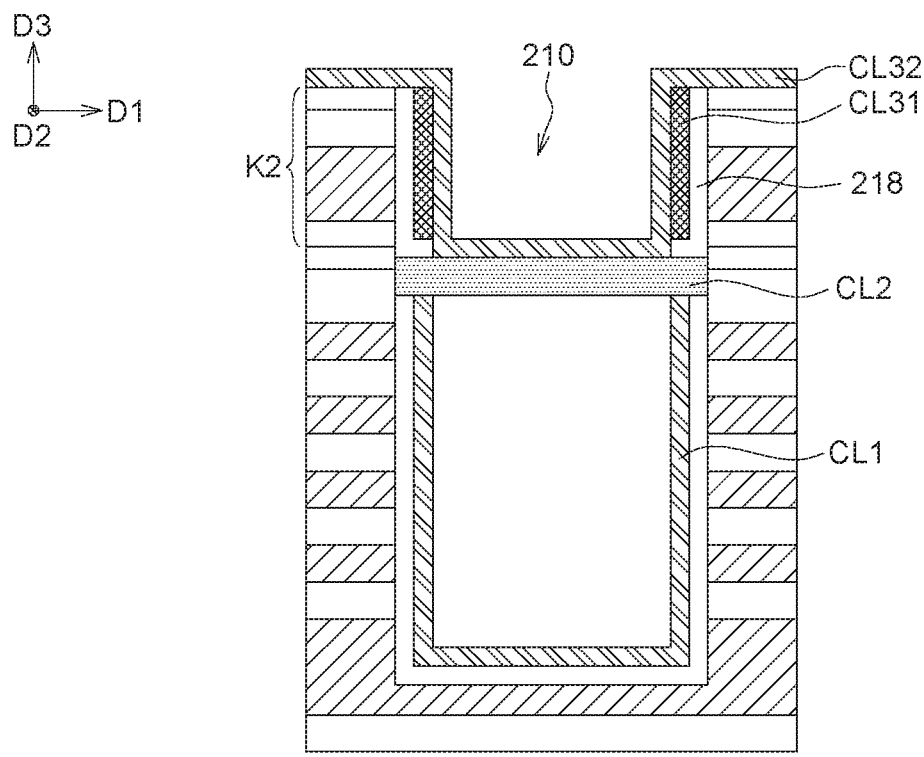

Referring to FIG. 12, a second channel layer CL32 may be formed on the second stacked layer K2, the gate dielectric layer 218, the connection layer CL2 and the first channel layer CL31. The second channel layer CL32 is formed on a sidewall surface of the gate dielectric layer 218 and an upper surface of the connection layer CL2. A material of the second channel layer CL32 may comprise a semiconductor material comprising a polysilicon, such as an un-doped polysilicon.

Figure 13:
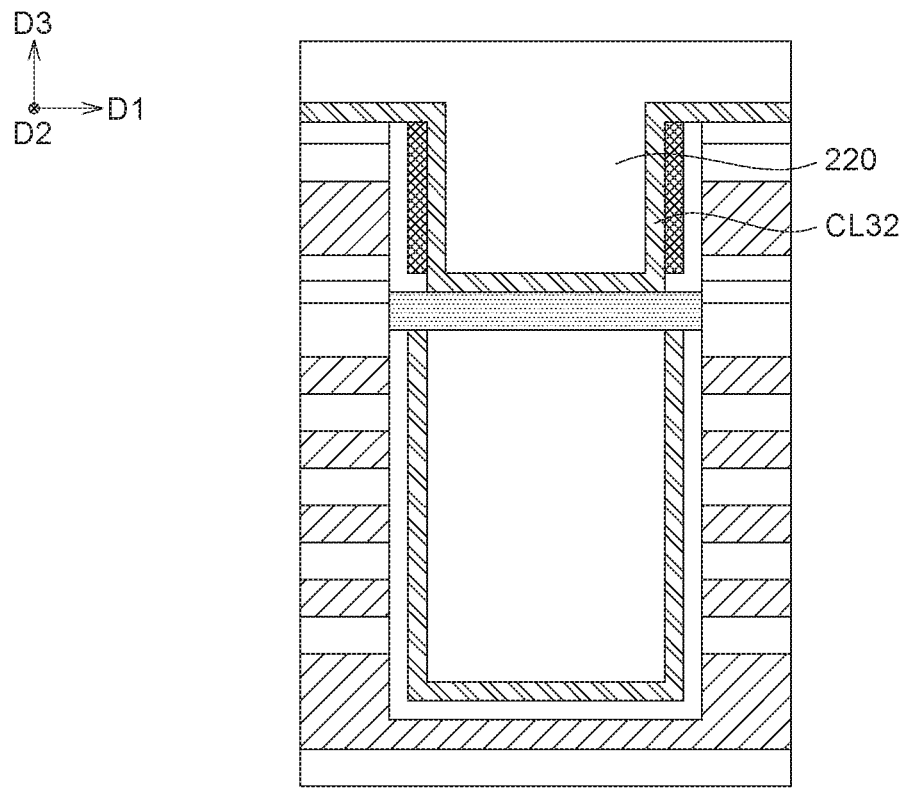

Referring to FIG. 13, an insulating material 220 may be formed on the second channel layer CL32. In an embodiment, insulating material 220 may comprise an oxide such as silicon oxide.

Figure 14:
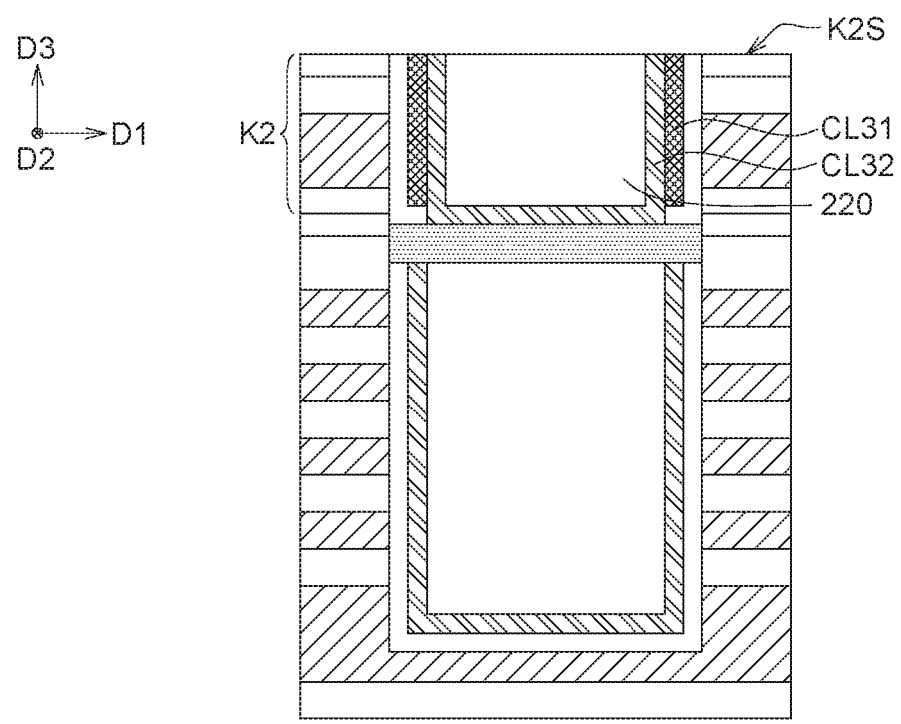

Referring to FIG. 14, a portion of the insulating material 220 and a portion of the second channel layer CL32 over the upper surface K2S of the second stacked layer K2 may be removed to make a top surface of the insulating material 220 aligning with the upper surface K2S. The removing step may be performed by an etching back process. The etching back process may comprise chemical mechanical polishing method.

Figure 15:
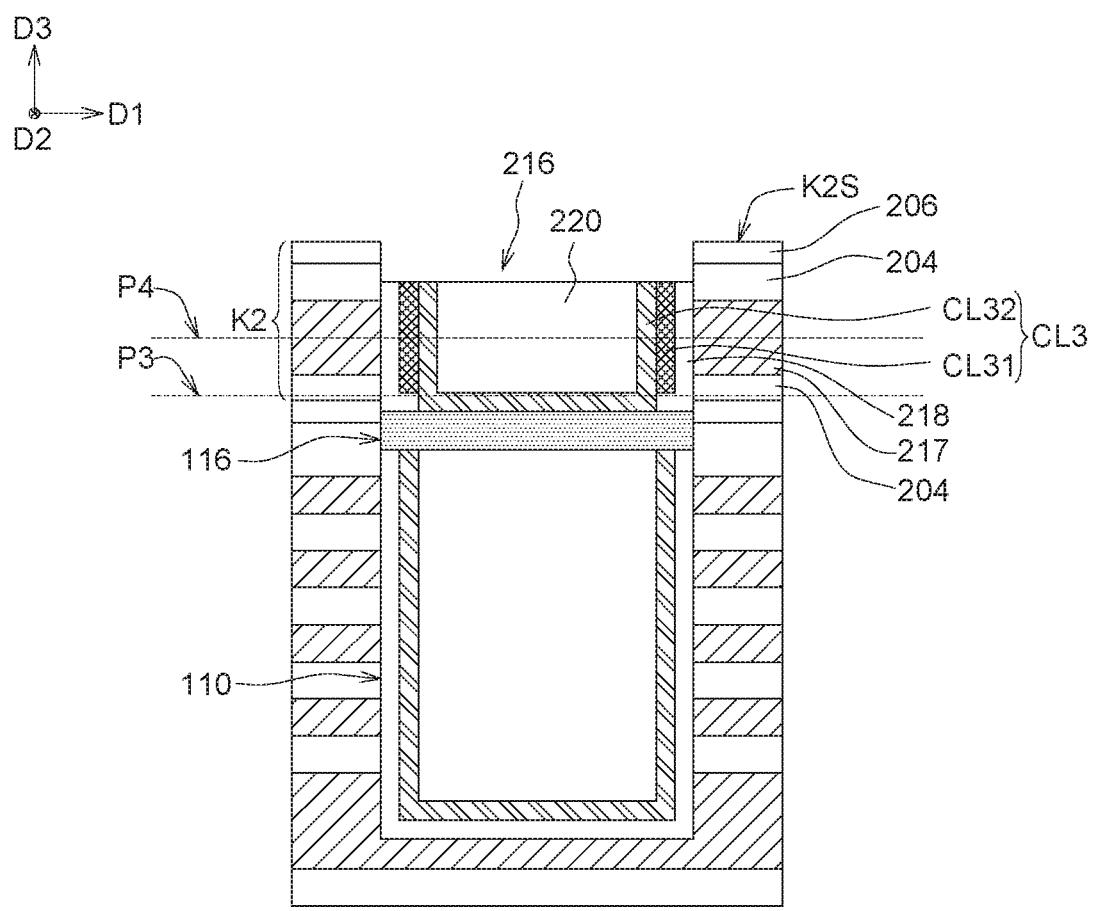

Referring to FIG. 15, an upper portion of the gate dielectric layer 218, the first channel layer CL31, the second channel layer CL32 and the insulating material 220 may be removed to form a recess 216 recessed from the upper surface K2S of the second stacked layer K2. The recess 216 may expose upper surfaces of the gate dielectric layer 218, the first channel layer CL31, the second channel layer CL32 and the insulating material 220, and sidewall surfaces of the top one of the insulating films 204 and the etching stop layer 206. A material of the second channel structure CL3 comprises a semiconductor material such as a doped semiconductor material or an un-doped semiconductor material. In an embodiment, the material of the second channel structure CL3 comprises a polysilicon, such as a doped polysilicon or an un-doped polysilicon. The second channel structure CL3 comprises the first channel layer CL31 and the second channel layer CL32. A material of the second channel structure CL3 comprises a semiconductor material, such as a doped semiconductor material or an un-doped semiconductor material. In an embodiment, the material of the second channel structure CL3 comprises a polysilicon, such as a doped polysilicon or an un-doped polysilicon. In an embodiment, the removing step may be performed by using a selective etching process with using the etching stop layer 206 as an etching mask. In this case, the recess 216 may substantially aligns with the first trench 110/recess 116. For example, a size of the recess 216 in the first direction D1 may be substantially equal to a size of the first trench 110/recess 116 in the first direction D1. A size of the recess 116 in the second direction D2 may be substantially equal to a size of the first trench 110/recess 116 in the second direction D2. In another embodiment, the recess 216 may be formed by patterning process performed to the structure shown in FIG. 14. In this case, a size/shape of the recess 216 may be different from a size/shape of the first trench 110/recess 116.

Figure 15A:
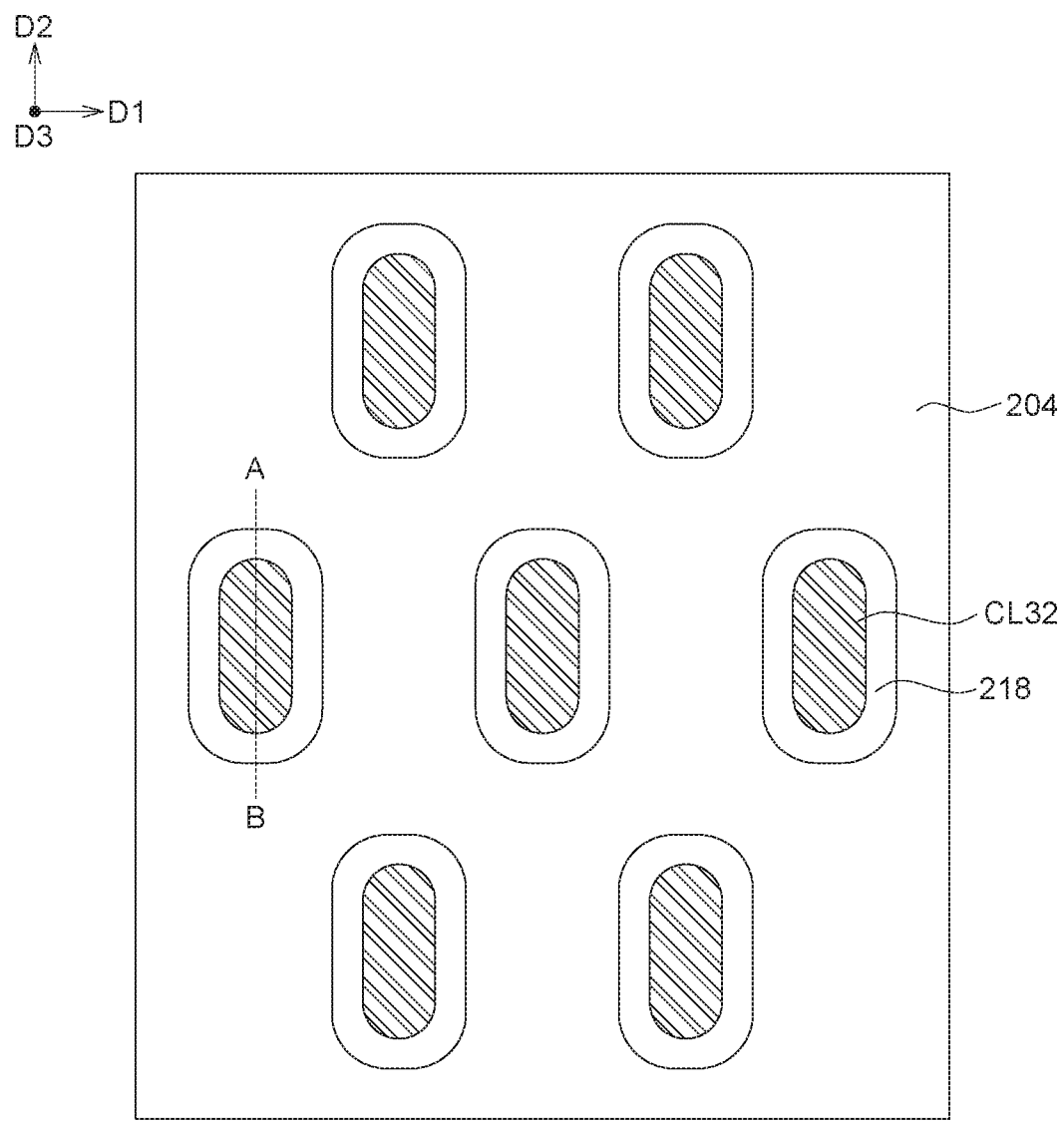
Figure 15B:
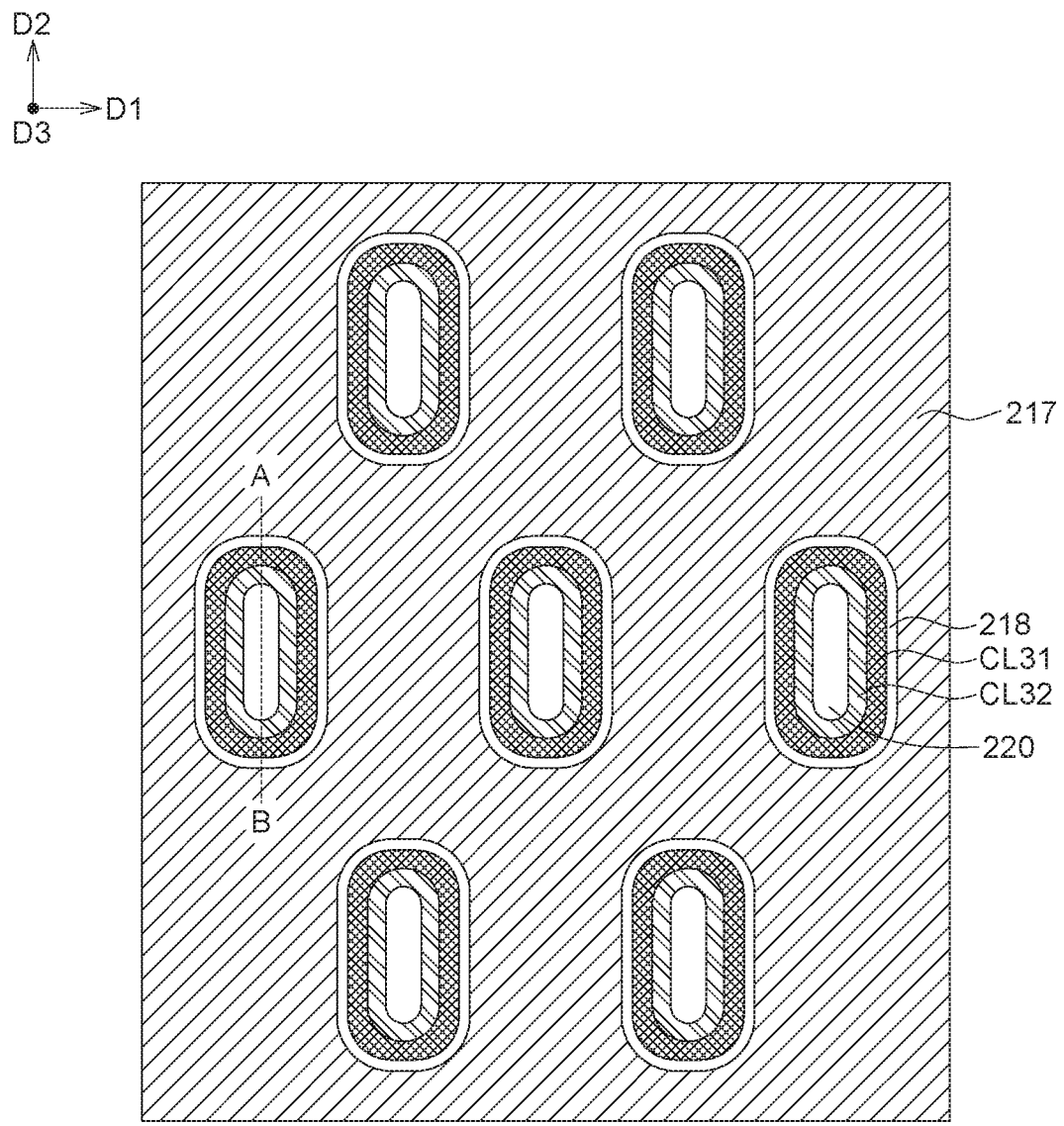

FIG. 15A illustrates a top view of the structure of FIG. 15 along a lateral cross-section view P3. FIG. 15b illustrates a top view of the structure of FIG. 15 along a lateral cross-section view P4. As shown in FIG. 15A and FIG. 15B, the remained gate dielectric layer 218 and the remained first channel layer CL31 have a ring shape, such as an ellipse ring shape (hollow), or an ellipse solid shape. The second channel layer CL32 may have a cup shape, comprising a cup bottom portion having a solid ellipse shape as shown in FIG. 15A, and a cup wall portion having a ring shape such as an ellipse ring shape as shown in FIG. 15B. The cup wall portion is adjoined on the cup bottom portion.

Figure 16:
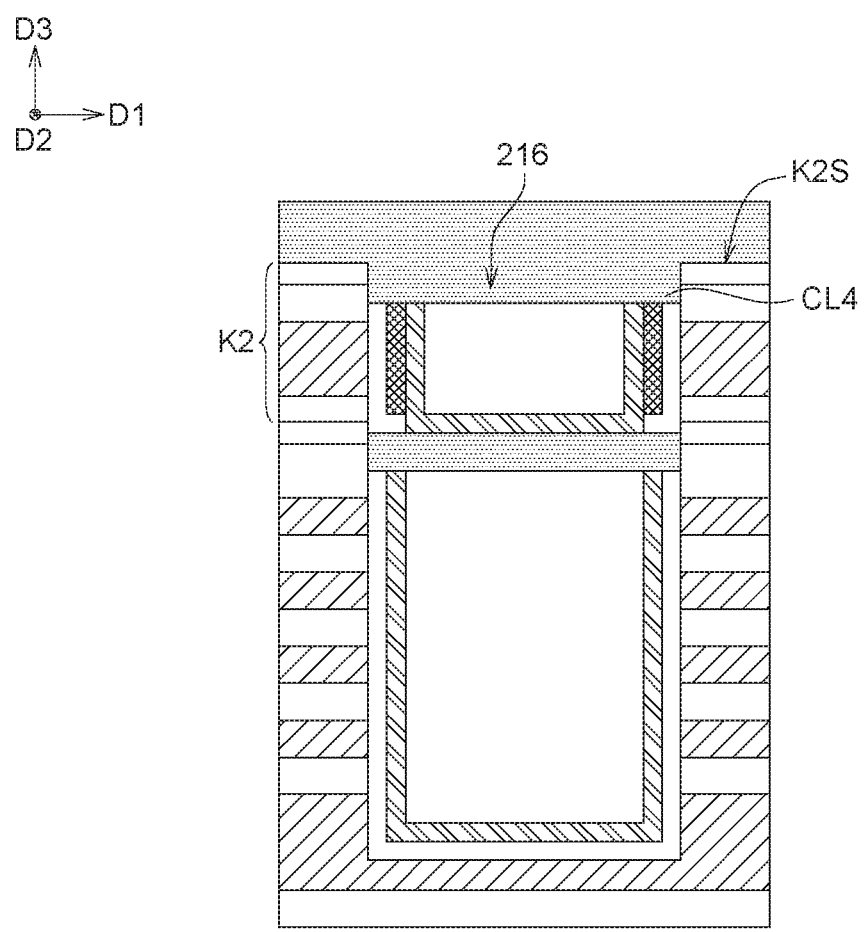

Referring to FIG. 16, a connection layer CL4 may be formed to fill the recess 216, and on the upper surface K2S of the second stacked layer K2. A material of the connection layer CL4 may comprise a conductive material such as a conductor material or a semiconductor material. The semiconductor material may comprise a polysilicon material, such as an N-type doped polysilicon. In an embodiment, a main material of the connection layer CL4 may be identical with those of the first channel structure CL1 and the second channel structure CL2, with a difference in that the first channel structure CL1 and the second channel structure CL2 use an un-doped polysilicon.

Figure 17:
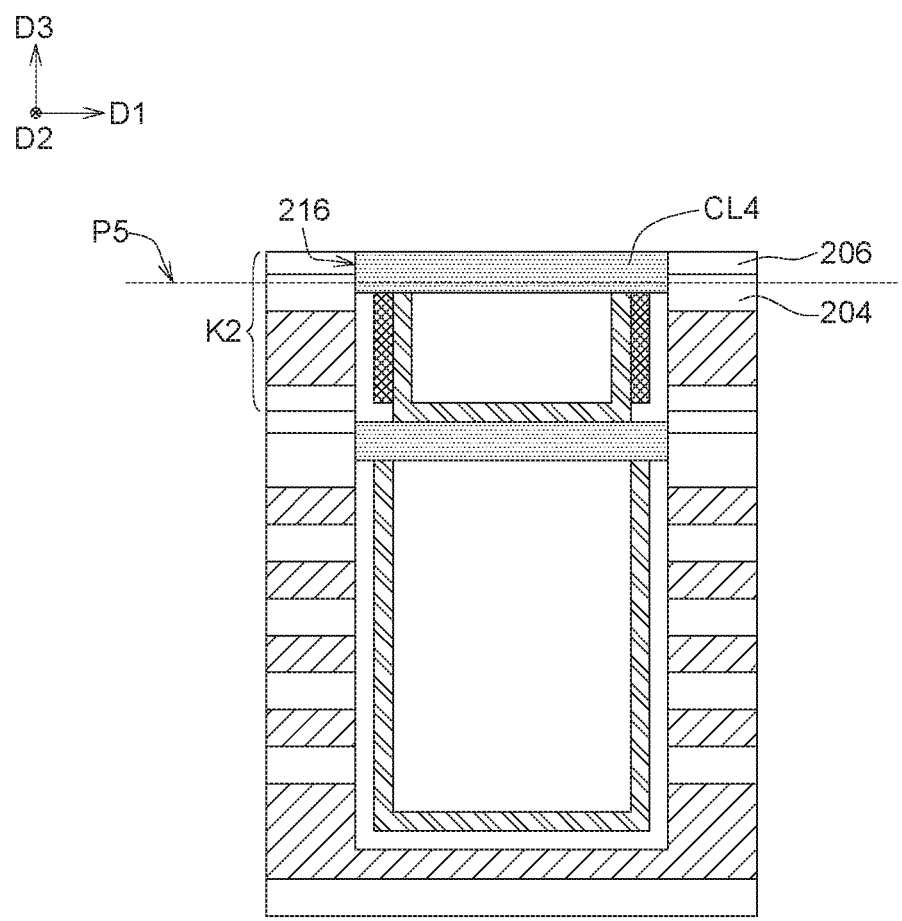

Referring to FIG. 17, a portion of the connection layer CL4 over the second stacked layer K2 may be removed by an etching back process. In an embodiment, the etching back process may comprise chemical mechanical polishing method or other suitable etching methods. The etching back process may form a structure having a flat upper surface.

Figure 17A:
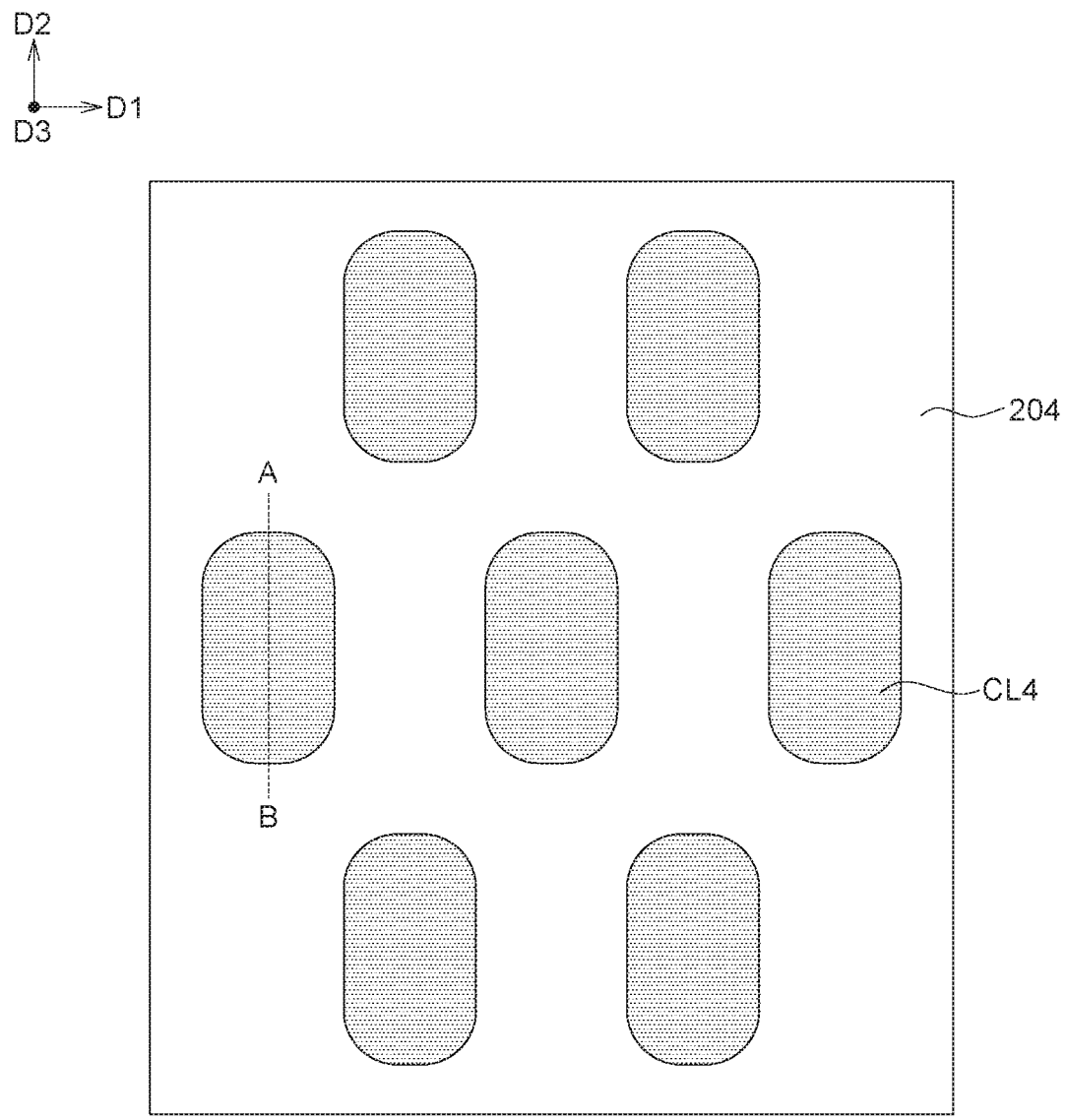

FIG. 17A illustrates a top view of the structure of FIG. 17 along a lateral cross-section view P5. As shown in FIG. 17A, the connection layer CL4 in the recess 216 has a solid ellipse shape.

Figure 18:
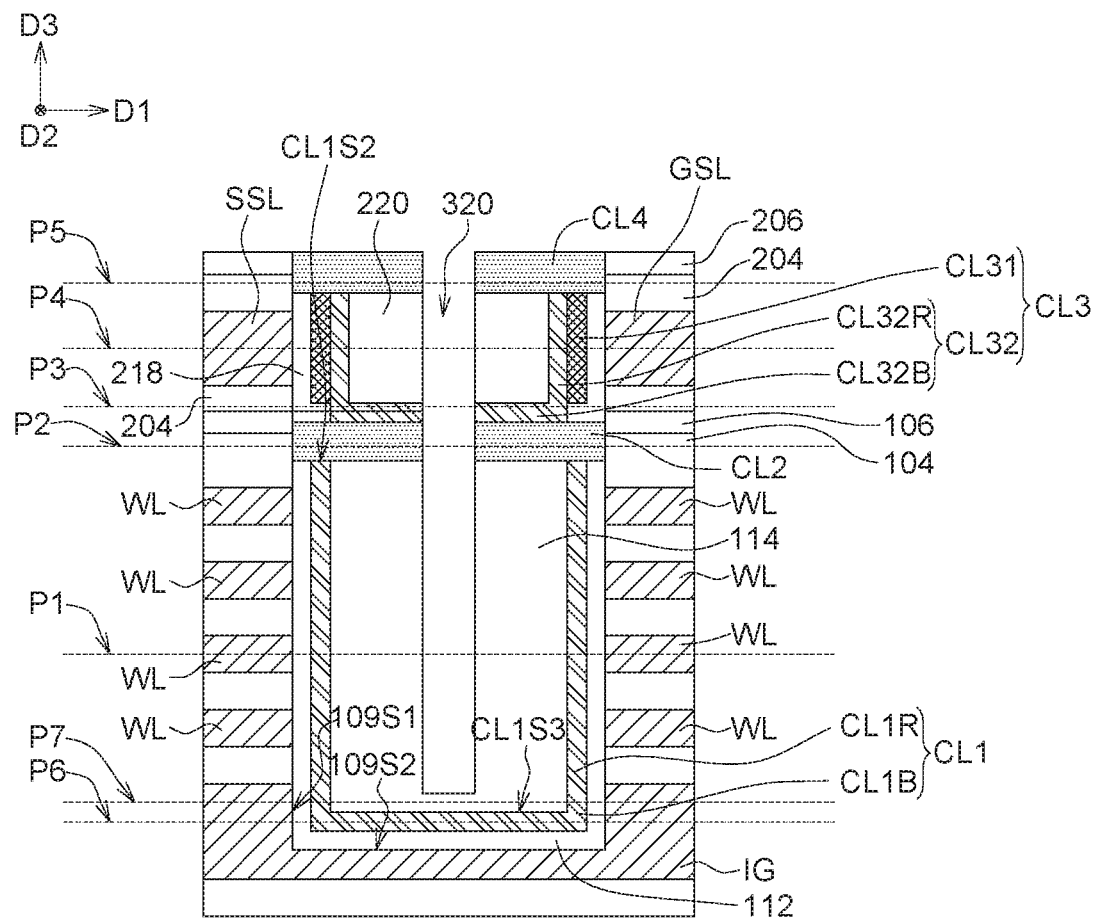

Referring to FIG. 18, an opening 320 is formed by a patterning process so as to segment the stack structure K into stack portions separated from each other. The opening 320 segments the first channel structure CL1, the connection layer CL2, the first channel layer CL3 and the connection layer CL4 into two channel portions separated from each other. In particular, the opening 320 segments the structure having ellipse shape into two structures having semi-ring shape (C shape). The patterning process for forming the opening 320 also simultaneously patterns the conductive layers (comprising the bottom conductive layer 109 and the conductive layers 111) of the first stack layer K1 and the top conductive layer 217 to form gate electrodes. The gate electrodes comprise a bottom electrode formed by patterning the bottom conductive layer 109, and the bottom electrode may be functioned as a bottom inversion gate electrode IG. The gate electrodes also comprise medium electrodes formed by patterning the conductive layers 111, and the medium electrodes may be functioned as word lines WL. In addition, the gate electrodes may also comprise top electrodes formed by patterning the top conductive layer 217, and the top electrodes may functioned as selection lines. The selection lines comprise a string selection line SSL and a ground selection line GSL separated from each other. In an embodiment, the gate dielectric layer 218 adjoined with the string selection line SSL/ground selection line GSL is a single layer silicon oxide film, such as pure silicon oxide film of single layer structure, and therefore the gate dielectric layer 218 can reduce disturbance of the string selection line SSL/ground selection line GSL due to avoiding charge storage in the gate dielectric layer 218 during an memory erase operation.

A channel structure is electrically coupled to the gate electrodes, and is disposed on sidewall surfaces of the gate electrodes. The channel structure comprises the first channel structure CL1 and the second channel structure CL3. The second channel structure CL3 is on the upper surface of the first channel structure CL1. The connection layer CL2 is between the first channel structure CL1 and the second channel structure CL3. For example, the connection layer CL2 is adjoined between the first ring shape channel layers CL1R of the first channel structure CL1 and the second bottom channel layers CL32B of the second channel structure CL3. The first channel structure CL1 and/or the second channel structure CL3 has a ring shape.

The charge storage layer 112 is between a portion of an inner surface of the stack structure K and the first channel structure CL1. A portion of the charge storage layer 112 is on corresponding sidewall surfaces of the bottom inversion gate electrode IG (bottom electrode) and the word lines WL (medium electrodes). The gate dielectric layer 218 is on another portion of the inner surface of the stack structure K and the second channel structure CL3. A portion of the gate dielectric layer 218 is on corresponding sidewall surfaces of the string selection line SSL/ground selection line GSL (top electrodes). The etching stop layer 106 is disposed between the string selection line SSL/ground selection line GSL (top electrode) and at least one of the word lines WL (medium electrodes).

Figure 18A:
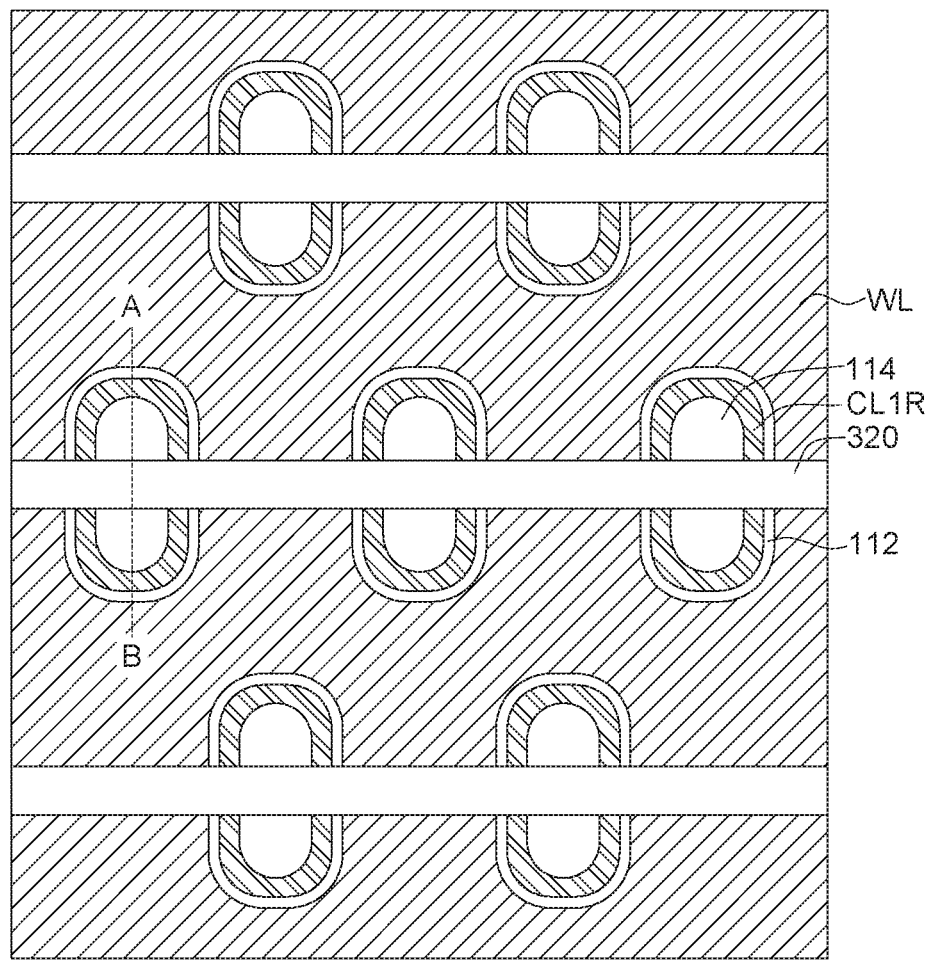
Figure 18B:
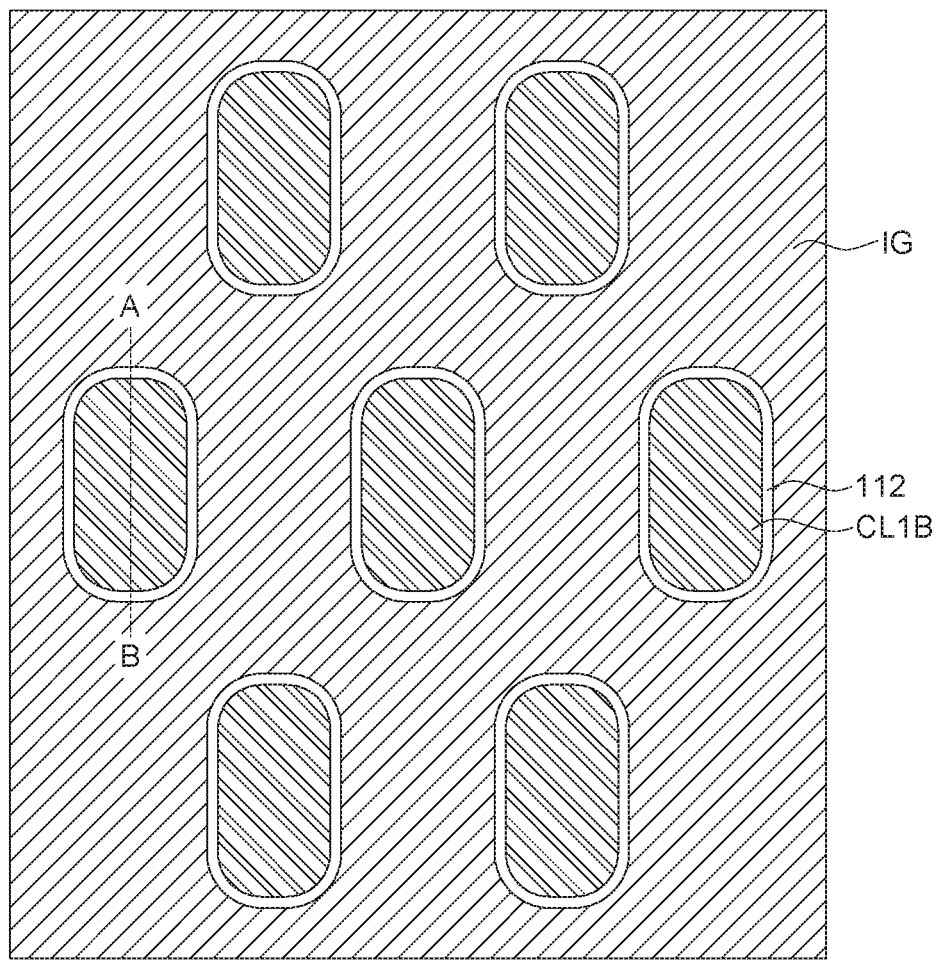
Figure 18C:
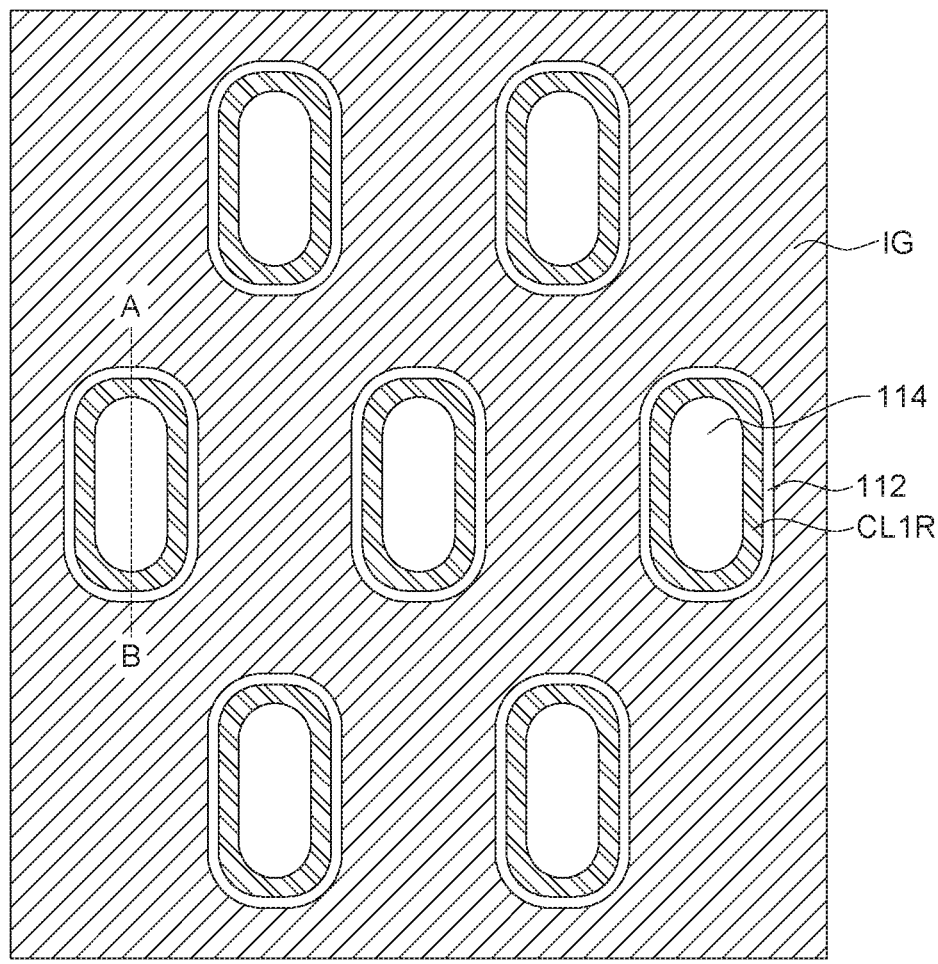

FIG. 18A illustrates a top view of the structure of FIG. 18 along a lateral cross-section view P1. FIG. 18B illustrates a top view of the structure of FIG. 18 along a lateral cross-section view P6. FIG. 18C illustrates a top view of the structure of FIG. 18 along a lateral cross-section view P7. Referring to FIG. 18, FIG. 18A FIG. 18B and FIG. 18C, the first channel structure CL1 comprises a first bottom channel layer CL1B and two first ring shape channel layers CL1R. The first ring shape channel layers CL1R are separated from each other, and are adjoined on two ends of the first bottom channel layer CL1B. The first bottom channel layer CL1B is on the sidewall surface 109S1 and the upper surface 109S2 of the bottom inversion gate electrode IG. The first ring shape channel layers CL1R are adjoined on the first bottom channel layer CL1B, and are separated from each other by the opening 320. A height (or a size of a third direction D3) of the first ring shape channel layer CL1R may be defined by a depth of the opening 320. The first bottom channel layer CL1B may be defined as a portion of the first channel structure CL1 below a bottom surface of the opening 320. In an embodiment, the first bottom channel layer CL1B has a cup bottom portion having an ellipse shape without being segmented by the opening 320. In another embodiment, the opening 320 may separate the first channel structures CL1. The first ring shape channel layers CL1R may be vertical to the first bottom channel layer CL1B preferably. The first direction D1, the second direction D2 and the third direction D3 may be different from each other. The first direction D1, the second direction D2 and the third direction D3 may be perpendicular to each other. For example, the first direction D1 may be X direction, the second direction D2 may be Y direction, and the third direction may be Z direction.

Figure 18D:
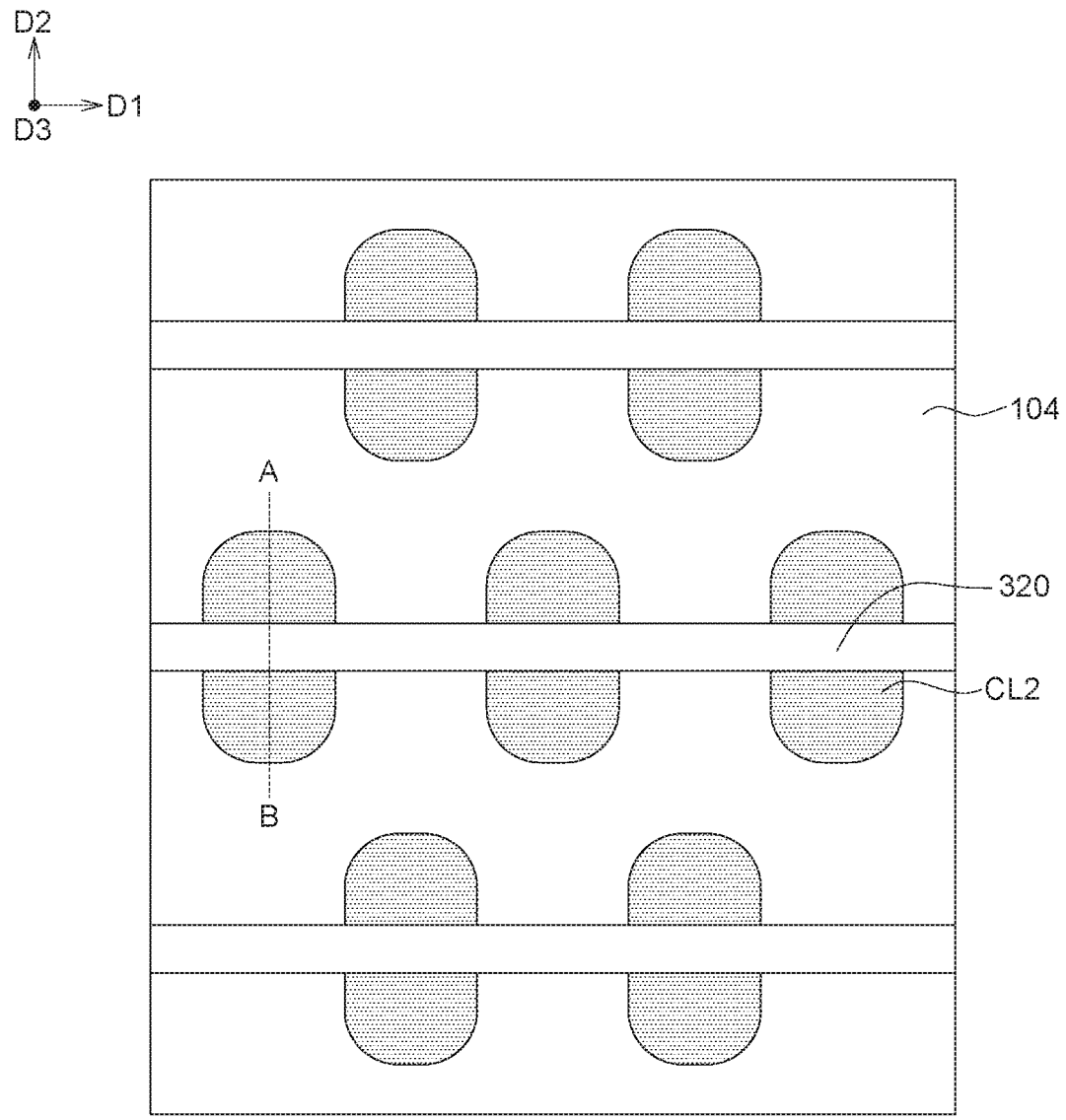

FIG. 18D illustrates a top view of the structure of FIG. 18 along a lateral cross-section view P2. Referring to FIG. 18, and FIG. 18D, the two connection layers CL2 separated from each other by the opening 320 are respectively on the upper surfaces CL1S2 of the first ring shape channel layers CL1R separated from each other by the opening 320. The two connection layers CL2 separated from each other both have a solid semi ring shape, and flat sidewall surfaces of the connection layers CL2 faces to each other.

Figure 18E:
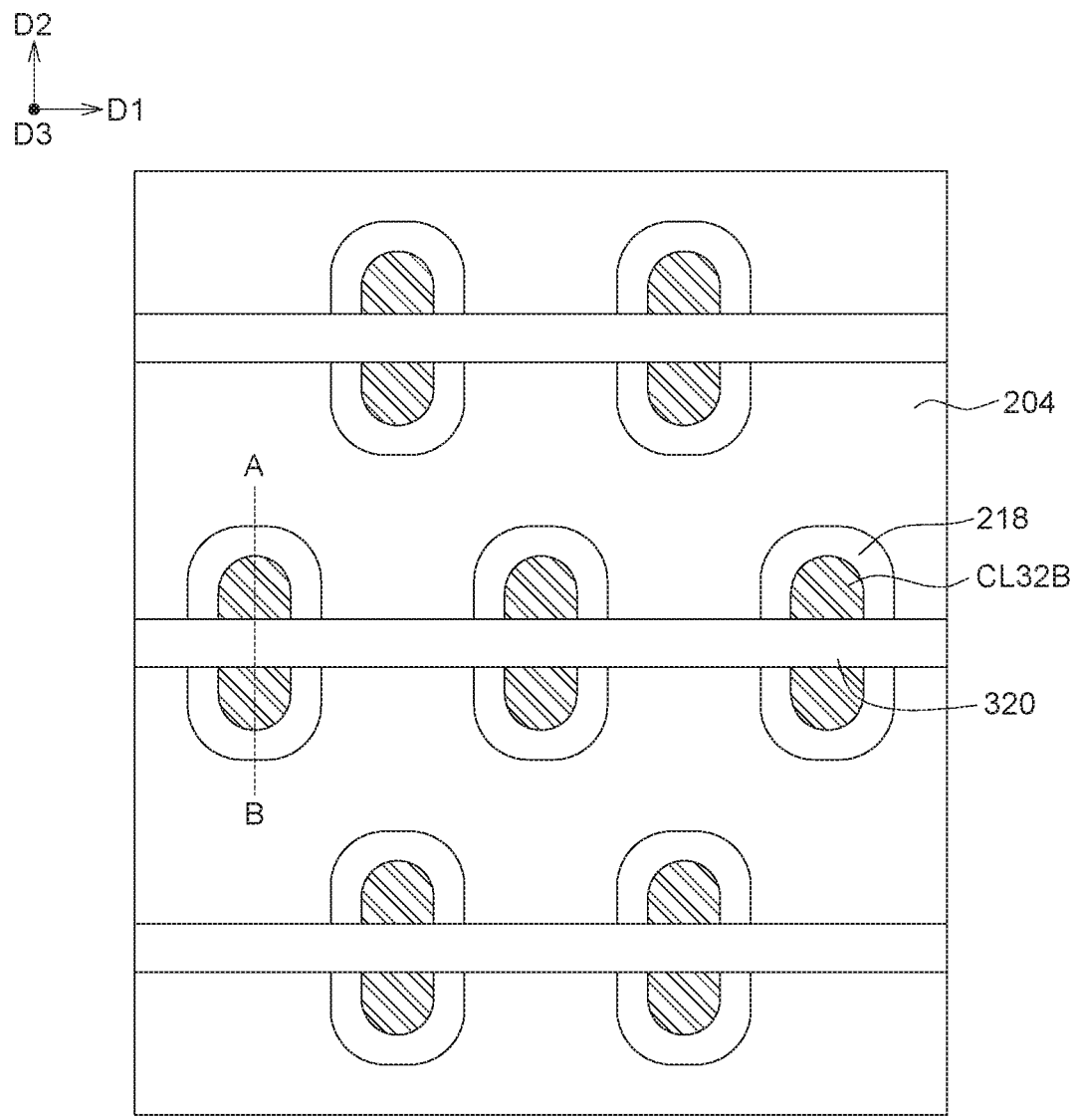
Figure 18F:
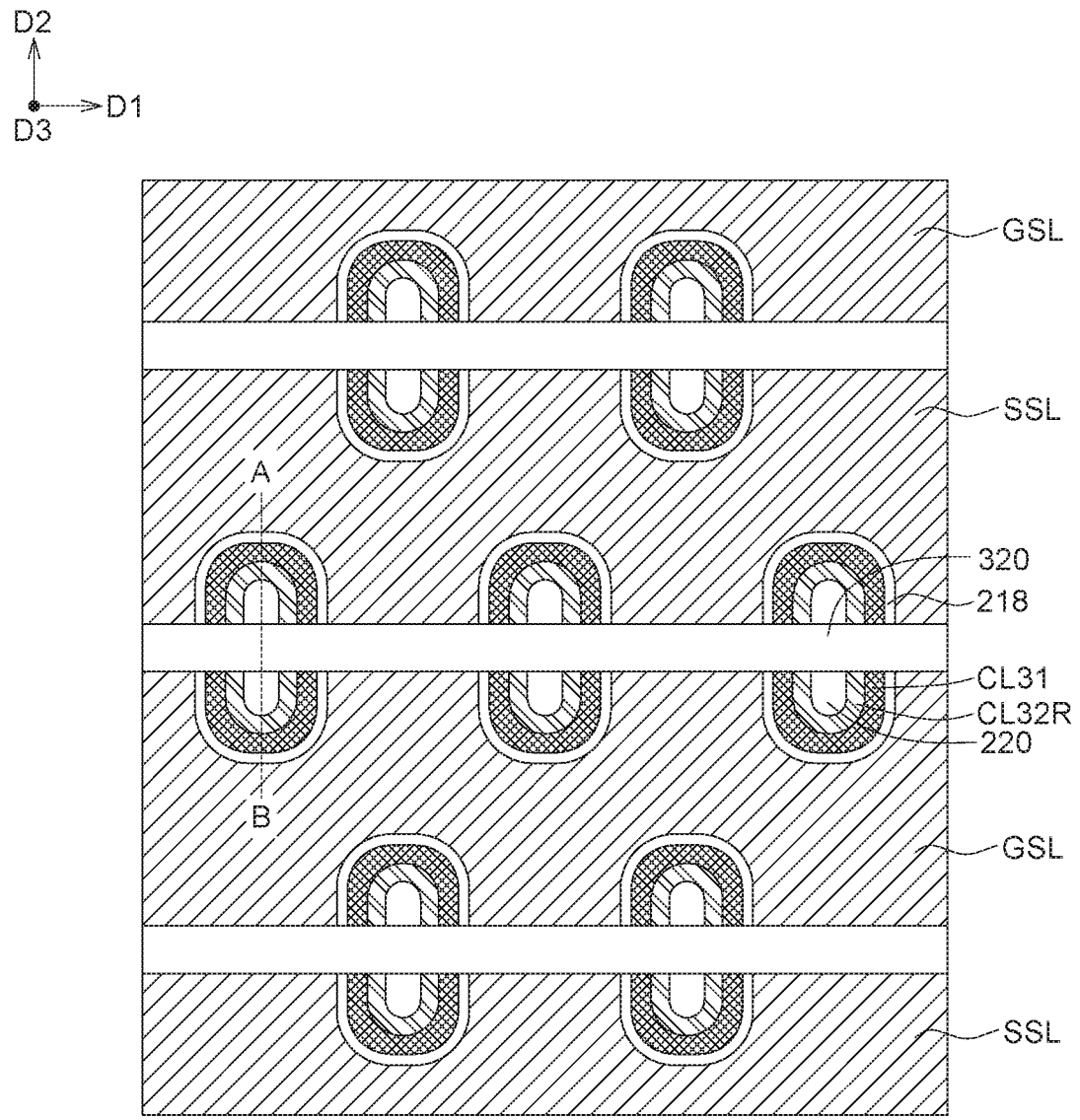

FIG. 18E illustrates a top view of the structure of FIG. 18 along a lateral cross-section view P3. FIG. 18F illustrates a top view of the structure of FIG. 18 along a lateral cross-section view P4. Referring to FIG. 18, FIG. 18E, and FIG. 18F, the first channel layer CL31 has a ring shape. The second channel layer CL32 may comprise two second bottom channel layers CL32B and two second ring shape channel layers CL32R. The two second bottom channel layers CL32B are separated from each other. The second bottom channel layer CL32B has the solid semi ring shape, for example a solid semi-ellipse shape. The two second ring shape channel layers CL32R are respectively adjoined on two ends of the two second bottom channel layers CL32B away from each other. The first channel layer CL31 is between the second channel layer CL32 and the stack structure K. The second ring shape channel layer CL32R has the hollow semi ring shape, for example a semi-ellipse shape.

Figure 18G:
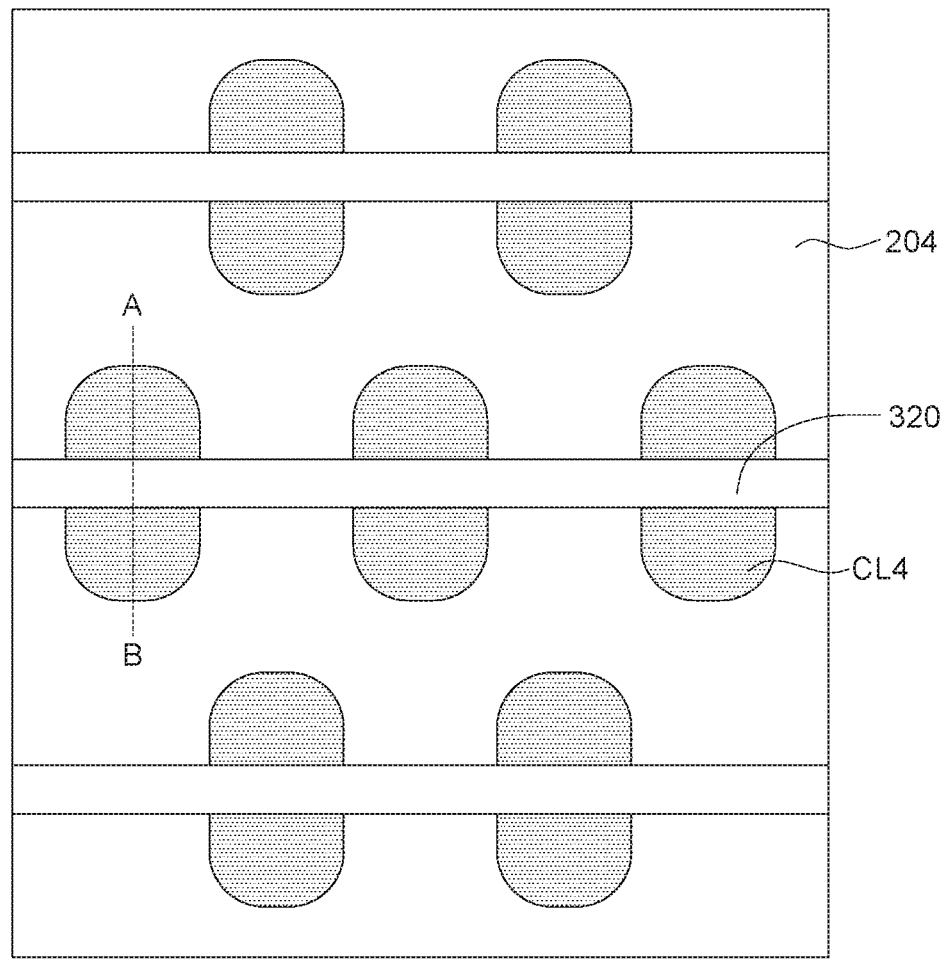

FIG. 18G illustrates a top view of the structure of FIG. 18 along a lateral cross-section view P5. Referring to FIG. 18, and FIG. 18G, the two connection layers CL4 separated from each other by the opening 320 are on the upper surfaces of the second ring shape channel layers CL32R of the first channel layer CL3. The connection layers CL4 both have a semi-ellipse shape, and have flat sidewall surfaces faces to each other.

In an embodiment, a radial thickness of the connection layer CL2 in the first direction D1 is larger than a radial thickness of the first ring shape channel layer CL1R in the first direction D1, and is larger than a radial thickness of the second ring shape channel layer CL32R in the first direction D1.

Figure 19:
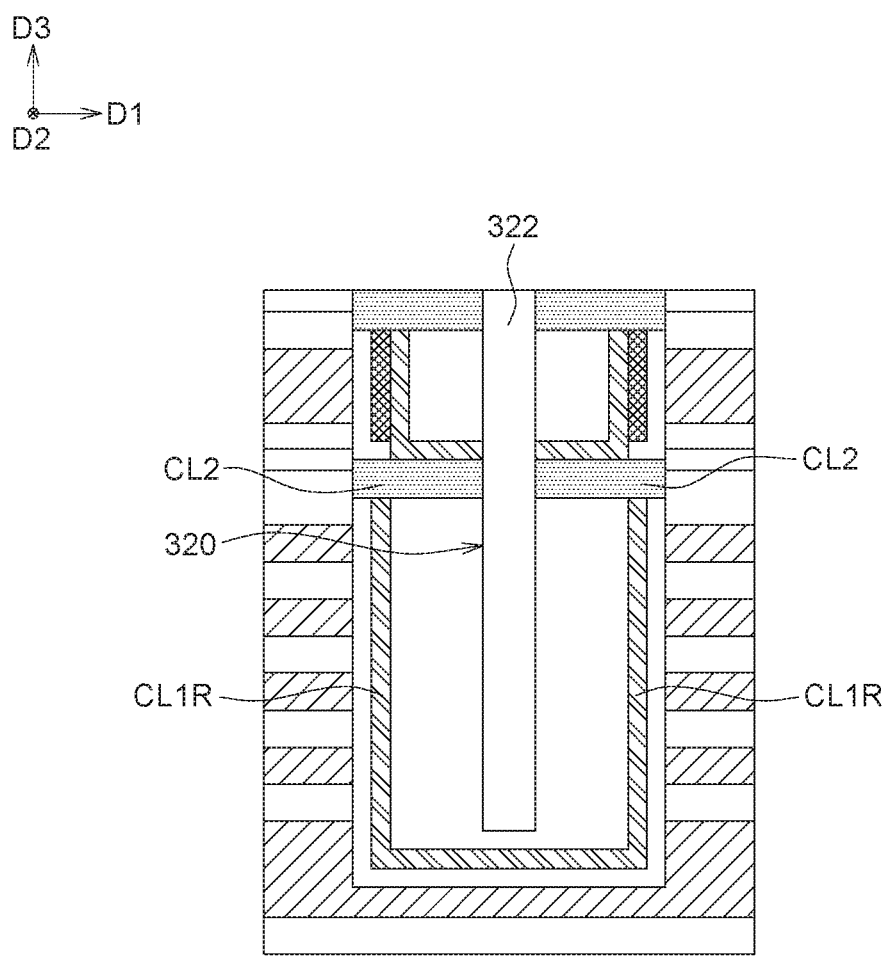

Referring to FIG. 19, an insulating wall 322 is formed to fill the opening 320. In an embodiment, the insulating wall 322 may comprise an oxide such as silicon oxide.

Figure 20:
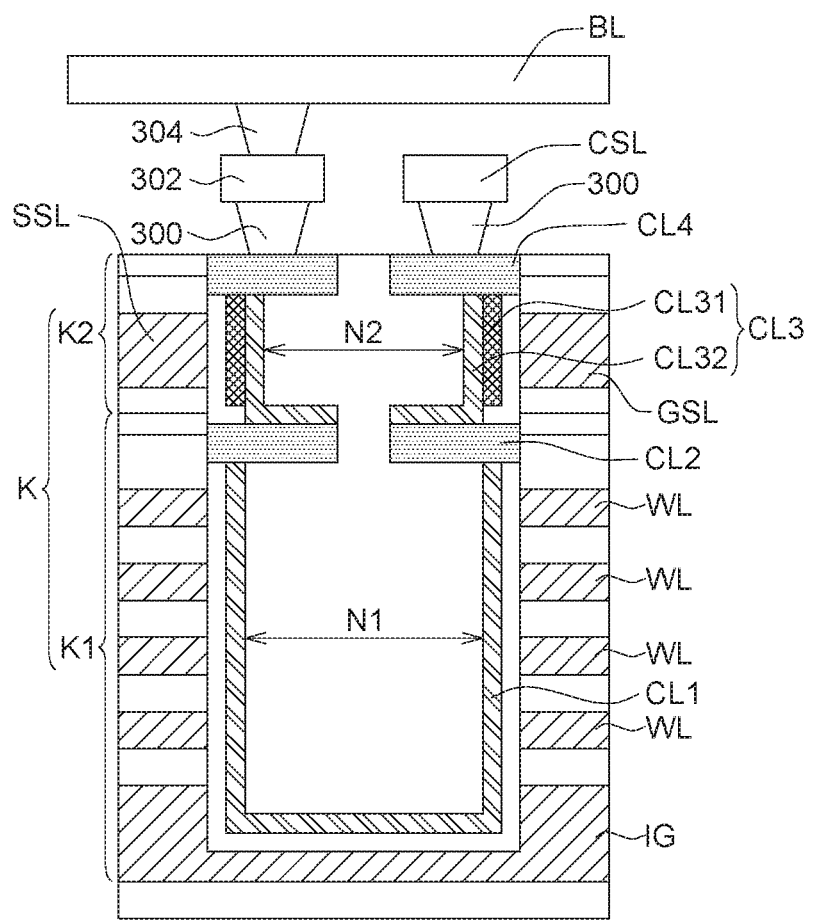

Referring to FIG. 20, a bit line BL and a common source line CSL may be formed over the stack structure. The bit line BL is electrically connected to the channel structure through a conductive pillar 300, a conductive pillar 304 and a conductive layer 302, and the common source line CSL is electrically connected to the channel structure through the conductive pillar 300 so as to form a NAND memory string. The conductive pillar 300, the conductive pillar 304 and the conductive layer 302 may be arranged according to actual demands, and the present disclosure is not limited thereto. The NAND memory string has memory cells are defined between the first channel structure CL1 and the word lines WL. The two first ring shape channel layers CL1R have a first gap distance N1 therebetween. The two second ring shape channel layers CL32R have a second gap distance N2 therebetween. The first gap distance N1 is larger than the second gap distance N2.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:
1. A memory device, comprising:
  a stack structure on a substrate and comprising gate electrodes and insulating films stacked alternately; and
  a channel structure electrically coupled to the gate electrodes, and on sidewall surfaces of the gate electrodes,
    wherein the channel structure comprises:
  a first channel structure, wherein the first channel structure comprises:
  one first bottom channel layer; and
  two first ring shape channel layers, wherein the two first ring shape channel layers are separated from each other in a lateral cross-section view of the memory device, and the two first ring shape channel layers are adjoined on two opposing ends of the one first bottom channel layer in a longitudinal cross-section view of the memory device, wherein the lateral cross-section view is parallel with a top surface of the substrate, the longitudinal cross-section view is perpendicular to the top surface of the substrate; and a second channel structure on an upper surface of the first channel structure, wherein the first channel structure and/or the second channel structure has a ring shape.

2. The memory device according to claim 1, wherein the second channel structure comprises:

a first channel layer; and a second channel layer, comprising:

two second bottom channel layers, wherein the two second bottom channel layers electrically connected to the one first bottom channel layer are separated from each other in another lateral cross-section view of the memory device, the another lateral cross-section view is parallel with the top surface of the substrate; and two second ring shape channel layers respectively adjoined on two opposing ends of the two second bottom channel layers away from each other, wherein the first channel layer is between the second channel layer and the stack structure.

3. The memory device according to claim 2, wherein the two first ring shape channel layers have a first gap distance therebetween, the two second ring shape channel layers have a second gap distance therebetween, wherein the first gap distance is larger than the second gap distance.

4. The memory device according to claim 2, wherein the first channel layer, the two second ring shape channel layers are a semi open ring shape in yet another lateral cross-section view of the memory device, the yet another lateral cross-section view is parallel with the top surface of the substrate, each of the two second bottom channel layers has a solid semi-ellipse shape in the another lateral cross-section view of the memory device.

5. The memory device according to claim 1, further comprising a connection layer between the first channel structure and the second channel structure.

6. The memory device according to claim 5, wherein materials of the first channel structure and the second channel structure comprises a doped semiconductor material or an un-doped semiconductor material, a material of the connection layer comprises a doped semiconductor material.

7. The memory device according to claim 1, further comprising:

a charge storage layer between a portion of an inner surface of the stack structure and the first channel structure; and a gate dielectric layer between an another portion of the inner surface of the stack structure and the second channel structure.

8. The memory device according to claim 7, wherein the gate electrodes comprise a bottom electrode, medium electrodes and a top electrode of a stack, and a portion of the charge storage layer is on corresponding sidewall surfaces of the bottom electrode and the medium electrodes, a portion of the gate dielectric layer is on a corresponding sidewall surface of the top electrode.

9. The memory device according to claim 8, further comprising an etching stop layer between the top electrode and at least one of the medium electrodes.

* * * * *